(12) United States Patent
Mei et al.

(10) Patent No.: US 7,341,893 B2
(45) Date of Patent: Mar. 11, 2008

(54) STRUCTURE AND METHOD FOR THIN FILM DEVICE

(75) Inventors: Ping Mei, Palo Alto, CA (US); Albert Jeans, Palo Alto, CA (US); Carl Taussig, Palo Alto, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 261 days.

(21) Appl. No.: 11/144,204

(22) Filed: Jun. 2, 2005

(65) Prior Publication Data

US 2006/0275963 A1    Dec. 7, 2006

(51) Int. Cl.
*H01L 21/00* (2006.01)
(52) U.S. Cl. .................. 438/149; 438/942; 257/21.023; 257/21.411
(58) Field of Classification Search ................ 438/149, 438/942; 257/E21.411, E21.023
See application file for complete search history.

(56) References Cited

U.S. PATENT DOCUMENTS

| | | | |
|---|---|---|---|
| 6,028,333 A | 2/2000 | Yamazaki et al. | |
| 6,351,841 B1 | 2/2002 | Tickle | |
| 6,476,419 B1 | 11/2002 | Yasuda | |
| 6,593,624 B2 * | 7/2003 | Walker | 257/344 |
| 6,808,646 B1 | 10/2004 | Jeans | |
| 7,056,834 B2 * | 6/2006 | Mei et al. | 438/758 |
| 2004/0002216 A1 | 1/2004 | Taussig et al. | |
| 2004/0217085 A1 | 11/2004 | Jeans | |

* cited by examiner

*Primary Examiner*—Michael Lebentritt
*Assistant Examiner*—Stanetta Isaac

(57) ABSTRACT

Provided is a thin film device and an associated method of making a thin film device. For example, a thin film transistor with nano-gaps in the gate electrode. The method involves providing a substrate. Upon the substrate are then provided a plurality of parallel spaced electrically conductive strips. A plurality of thin film device layers are then deposited upon the conductive strips. A 3D structure is provided upon the plurality of thin film device layers, the structure having a plurality of different heights. The 3D structure and the plurality of thin film device layers are then etched to define a thin film device, such as for example a thin film transistor that is disposed above at least a portion of the conductive strips.

26 Claims, 19 Drawing Sheets

STRUCTURE AND METHOD FOR THIN FILM DEVICE

FIELD OF THE INVENTION

The present invention relates generally to the field of forming semiconductor devices and, in particular, to a structure and method of forming a thin film device such as a thin film bottom gate thin film transistor.

BACKGROUND

Socially and professionally, most people rely upon video displays in one form or another for at least a portion of their work and/or recreation. With a growing demand for large screens and high definition television (HDTV), cathode ray tubes (CRTs) have largely given way to displays composed of liquid crystal devices (LCDs), light emitting diodes (LEDs), plasma display panels (PDPs), or front or rear projection systems.

A CRT operates by a scanning electron beam exciting phosphorous-based materials on the back side of a transparent screen, wherein the intensity of each pixel is commonly tied to the intensity of the electron beam. With an LED and plasma display, each pixel is an individual light-emitting device capable of generating its own light. With an LCD display, each pixel is a transient light-emitting device, individually adjusted to permit light to shine through or reflect through the pixel by altering the polarization of the transmitted or reflected light.

As LCD, plasma and LED screens do not utilize a large tube, as in a CRT, LCD, plasma and LED screens may be quite thin and, in many cases, are lighter than comparable CRT displays. As such, large and small flat screen displays can be provided to improve the portability of laptop computers, video displays in vehicles and airplanes, and information displays that are mounted or set in eye-catching locations.

A plurality of thin film devices, such as transistors, are typically incorporated into the screens of such flat screen devices as LCD, plasma and LED displays. Specifically, one or more transistors are commonly used to control the behavior of each pixel within the display. The individual nature of each pixel of an LED, plasma or LCD display introduces the possibility that each pixel may provide a different quantity of light. One pixel may be brighter or darker than another, a difference that may be quite apparent to the viewer.

As a flat screen display may incorporate hundreds of thousands of transistors, great care is generally applied in the fabrication of LED, plasma and LCD displays in an attempt to ensure that the pixels (and more specifically, the backplane transistors controlling the pixels) are as uniform and consistently alike as is possible. Frequently, especially with large displays, quality control measures discard a high percentage of displays before they are fully assembled. As such, displays are generally more expensive than they otherwise might be, as the manufacturers must recoup the costs for resources, time and precise tooling for both the acceptable displays and the unacceptable displays.

Traditionally, thin film devices have been formed through processes such as photolithography. In a photolithographic process, a substrate is provided and at least one material layer is uniformly deposited upon the substrate. A photoresist layer, also commonly known simply as a photoresist, or even a resist, is deposited upon the material layer, typically by a spin coating machine. A mask is then placed over the photoresist and light, typically ultra-violet (UV) light, is applied through the mask to expose portions of the photoresist. During the process of exposure, the photoresist undergoes a chemical reaction. Generally, the photoresist will react in one of two ways.

With a positive photoresist, UV light changes the chemical structure of the photoresist so that it is soluble in a developer. What "shows" therefore goes, and the mask provides a copy of the patterns which are to remain—such as, for example, the trace lines of a circuit. Photolithography may also be considered a 2D process, in that each layer of material is deposited and then masked. Although 3D structure may be created by stacking layers patterned via the 2D process, there is no inherent alignment feature between the layers.

A negative photoresist behaves in the opposite manner—the UV exposure causes it to polymerize and not dissolve in the presence of a developer. As such, the mask is a photographic negative of the pattern to be left. Following the developing with either a negative or positive photoresist, blocks of photoresist remain. These blocks may be used to protect portions of the original material layer, or serve as isolators or other components.

Very commonly, these blocks serve as templates during an etching process, wherein the exposed portions of the material layer are removed, such as, for example, to establish a plurality of conductive rows.

The process may be repeated several times to provide the desired thin film devices. As such, new material layers are set down on layers that have undergone processing. Such processing may inadvertently leave surface defects and/or unintended contaminant particles in the prior layers.

With respect to transistors, there are two types—bottom-gate transistors and top gate transistors. Bottom-gate transistors incorporating amorphous silicon are generally more desirable then top gate amorphous silicon transistors. This is due in part to better device performance in terms of a higher electron field effect mobility and a lower off-state leakage current.

Although desirable, the fabrication of bottom-gate amorphous silicon transistors requires precise alignment between source/drain contacts and the gate electrode. In a typical bottom-gate transistor structure, a metal gate material is formed on a substrate. A desired gate electrode is then formed by a conventional photolithographic process.

Summarized, a dielectric layer is formed over the gate metal, and a layer of active material in which a channel will be formed is deposited over the dielectric layer. In many instances a contact layer, such as, for example, a-Si:H doped to be N+, is deposited over the dielectric layer prior to the deposition of a top metal layer.

Lithography, or a similar process, and subsequent etching processes are then employed to remove a section of the top metal layer and contact layer (if provided), lying roughly over the gate metal. This removal forms the gate and drain contact electrodes. Since photolithography and etching processes may introduce at least 1μ alignment error, there are overlaps between source/drain contacts and the gate electrode by design, to ensure the electrical continuity between the source and drain when the TFT channel is at an on state.

While leaving the overlaps alleviates the alignment problem, there are several drawbacks and therefore reasons to minimize the amount of overlap. For example, the overlap causes the channel to be longer than otherwise would be necessary, which in turn limits the reduction in size of the overall structure. The TFT source to drain current is proportional to the ratio of the channel width to the channel length. Reducing the overlaps shrinks the length of the transistor, and thus provides more room for other components that may be required for an eventual device.

Furthermore, and perhaps most importantly, parasitic capacitance is established between the source/drain electrode material and the gate material in the areas of overlap. This parasitic capacitance results in feed-through voltage. When the TFT is incorporated into a display backplane to control a display pixel, this may result in inadvertent turning on of the pixel. This uncontrolled behavior results in image flicker (inaccuracy in the Off-to-On transition of the TFT), and sticking (inaccuracy in the On-to-Off transition of the TFT) in the case of a display device. In the case of a sensor device, parasitic capacitance results in readout noise.

Further, due to variations in the substrate, resolution of the lithography, alignment of the lithographic mask and other factors, the overlap may vary from TFT to TFT in an array. Such variance thus permits a variance in feed-through voltage from TFT to TFT. More simply stated, the plurality of TFTs in the array will have a range of different performance factors.

Photolithography is a precise process applied to small substrates. In part, this small-scale application is due to the high cost of the photo masks. For the fabrication of larger devices, typically, rather than employing a larger and even more costly photo mask, a smaller mask is repeatedly used—a process that requires precise alignment.

As a photolithographic process typically involves multiple applications of materials, repeated masking and etching, issues of alignment between the thin film layers is of high importance. A photolithographic process is not well suited for formation of thin film devices on flexible substrates, where expansion, contraction or compression of the substrate may result in significant misalignment between material layers, thereby leading to inoperable thin film devices. In addition, a flexible substrate is not flat—it is difficult to hold flat during the imprinting process and thickness and surface roughness typically cannot be controlled as well as with glass or other non-flexible substrates.

The issue of flatness in photolithography can be a problem because the minimum feature size that can be produced by a given imaging system is proportional to the wavelength of the illumination divided by the numerical aperture of the imaging system. However, the depth of field of the imaging system is proportional to the wavelength of the illumination divided by the square of the numerical aperture. Therefore, as resolution is increased, the flatness of the substrate quickly becomes the critical issue.

With respect to the flat screen displays introduced above, use of flexible substrates for the internal backplane controlling the pixels is often desired. Such a flexible substrate can provide a display with flexible characteristics. A flexible substrate may also be easier to handle during fabrication and provide a more mechanically robust display for the user.

Hence, there is a need for a process to provide at least one thin film transistor that overcomes one or more of the drawbacks identified above.

SUMMARY

The present disclosure advances the art by providing at least one TFD.

In particular, and by way of example only, according to an embodiment, provided is a method of forming at least one TFD, including: providing a substrate; providing a plurality of parallel spaced electrically conductive strips upon the substrate; depositing a plurality of thin film device layers upon the conductive strips; providing a 3D structure upon the plurality of thin film device layers, the 3D structure having a plurality of different heights; and etching the 3D structure and plurality of thin film device layers to define a TFD device disposed above at least a portion of the conductive strips.

In yet another embodiment, provided is a TFD device, including: a substrate; a gate provided by a plurality of parallel spaced electrically conductive strips upon the substrate; a channel disposed above the gate, the channel transverse to the conductive strips; and a source electrode and a drain electrode aligned to the channel.

DETAILED DESCRIPTION

Figure 1:
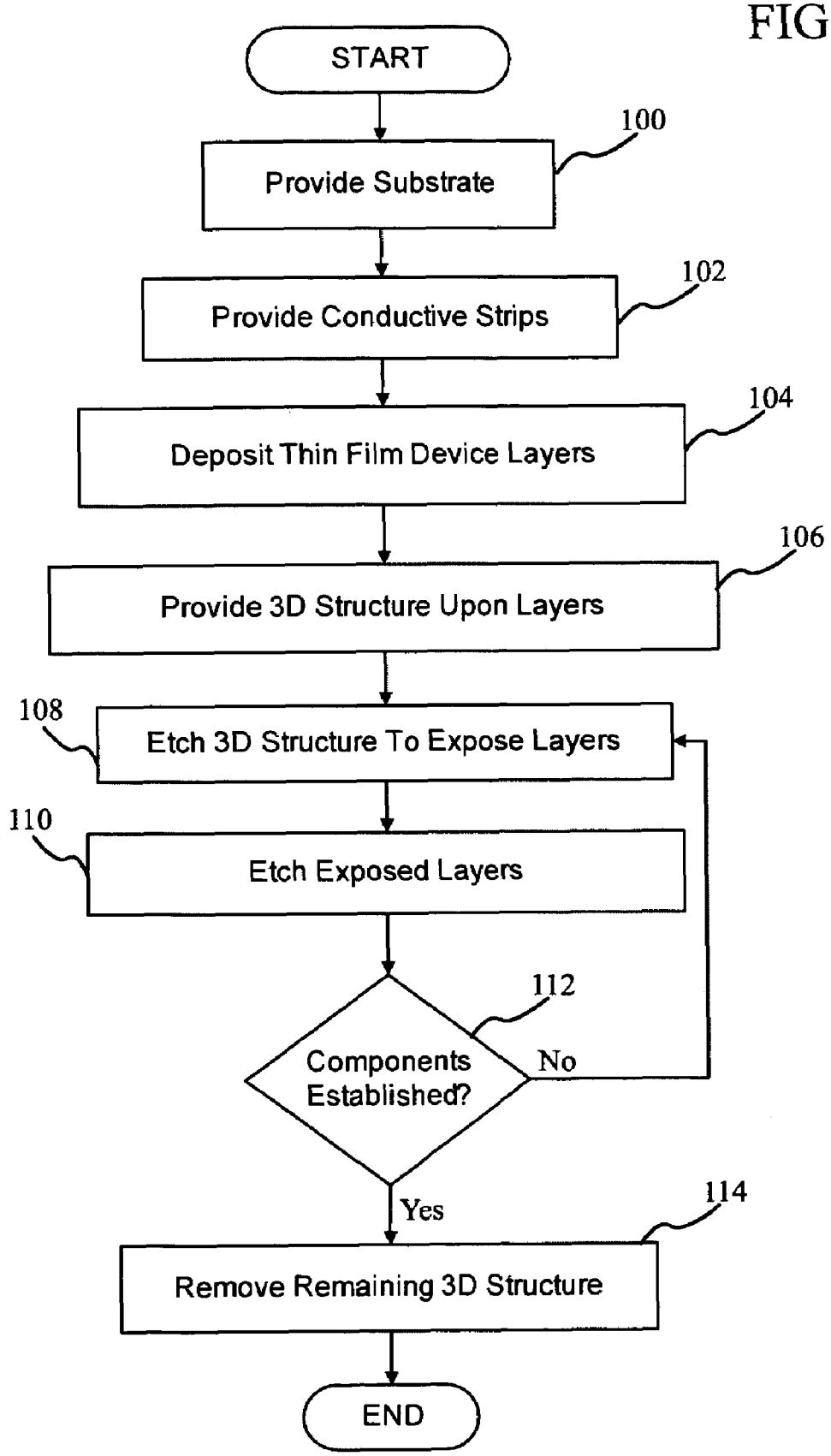
FIG. 1 is a high level flowchart of at least one method embodiment.

Before proceeding with the detailed description, it is to be appreciated that the present teaching is by way of example, not by limitation. Thus, although the instrumentalities described herein are for the convenience of explanation shown and described with respect to exemplary embodiments of thin film devices ("TFDs") and specifically thin film transistors ("TFTs"), it will be appreciated that the principles herein may be applied equally in other types of thin film devices ("TFDs").

In at least one embodiment, the method for forming at least one TFTD incorporates Self-Aligned Imprint Lithography ("SAIL"), a recently developed technique for producing multilayer patterns on flexible substrates. The basics of this process are set forth and described in U.S. patent application Ser. No. 10/104,567, published as U.S. Patent Publication No. 20040002216, the disclosure of which is incorporated herein by reference.

The SAIL technique uses a 3D patterned resist and is typically employed in roll-to-roll processing. As the 3D resist is flexible, the pattern will stretch or distort to the same degree as the substrate. As such, a SAIL roll-to-roll fabrication process may be employed to provide low cost manufacturing solutions for devices such as flat and/or flexible displays, or other devices suitable for roll-to-roll processing.

Utilizing height differences in an imprinted 3D stamp or other provided 3D structure, multi-level pattern information is provided and self-alignment maintained independent of the instability of a flexible substrate. It shall also be realized that the disclosed method may be employed upon a non-flexible substrate while remaining within the spirit and scope of at least one embodiment.

Referring now to the drawings, FIG. 1 through FIG. 19 conceptually illustrate at least one embodiment of providing a TFD, and more specifically a TFT with nano-gaps in the gate. It will be appreciated that the described process need not be performed in the order in which it is herein described, but that this description is merely exemplary of at least one preferred method of performing a SAIL process with pattern reversal to form an active matrix of thin film devices. In addition, it is understood and appreciated that the scale of the components and features illustrated in the Figures has been exaggerated to facilitate ease of discussion.

FIG. 1 is a high-level flowchart of a method for reversing the pattern in a SAIL process. As indicated in block 100, the processes are generally commenced by providing a substrate. In at least one embodiment, the substrate is flexible. A plurality of parallel spaced conductive strips are then provided upon the substrate, block 102. Upon the established conductive strips, a plurality of thin film device layers appropriate for the desired purpose of the eventual device are deposited, block 104.

A 3D structure is then provided upon the stack of thin film device layers, block 106. It is to be appreciated that under the present method all thin film device layers are advantageously deposited before etching is performed. As such, deposition conditions for thin film layers are not limited by material properties of the 3D structure.

As discussed below, the 3D structure in at least one embodiment is formed from an imprint polymer. In addition, the 3D structure has a plurality of different heights. As in block 108, the 3D structure is etched to expose portions of the thin film layers. The exposed portions of the thin film layers are then etched as well, block 110.

Etching of the 3D structure, block 108, and the exposed portions of the thin film layers, block 110, is repeated so as to define the desired components for the device, decision 112. More specifically, etching of the 3D structure and the resulting exposed portions of the thin film layers is alternated so as to provide a source electrode, a drain electrode, and a channel. In addition, such etch processing serves to ensure that the gate controller is aligned to the channel.

As the 3D structure is directly upon the thin film layers, the varying levels of the structure provide alignment to define device features without frustration from flexible distortion of the substrate, the stacked thin film layers and the 3D structure. In at least one embodiment, following the formation of the desired components, the remaining 3D structure is removed, block 114.

Figure 2:
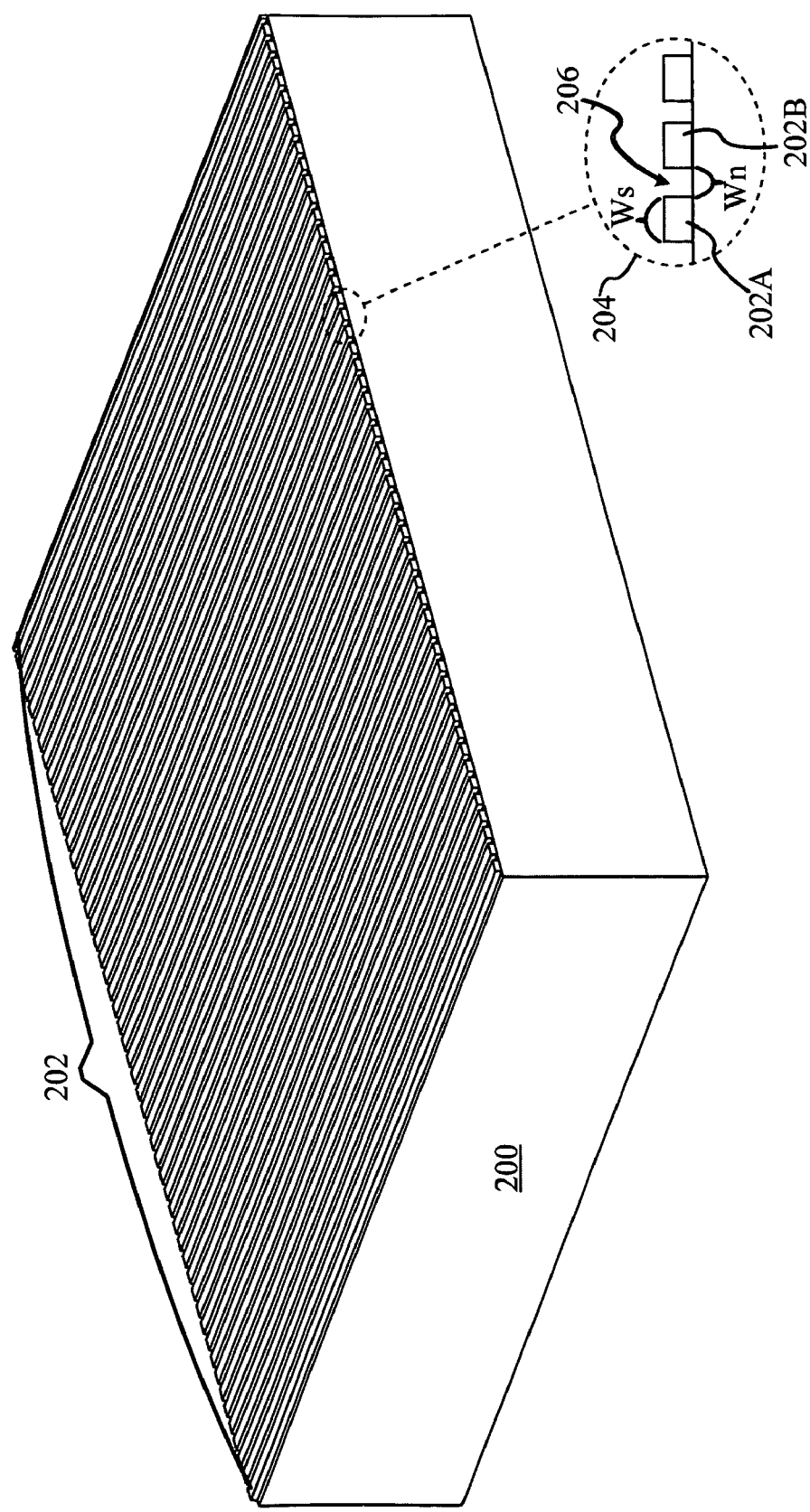
FIG. 2 is a perspective view of a substrate with a plurality of parallel spaced conductive strips in accordance with an embodiment.

Turning to FIG. 2, provided is a more detailed illustration of the initial process described above. For purposes of discussion, the fabrication of a bottom-gate thin film transistor (TFT) will be used as an example. As shown in FIG. 2, there is shown a portion of a substrate 200 upon which are provided a plurality of parallel spaced conductive strips 202. Typically, the substrate 200 is chemically cleaned to remove any particulate matter, organic, ionic and/or metallic impurities or debris which may be present upon the surface of the substrate 200 before the conductive strips 202 are provided.

In at least one embodiment, substrate 200 is a flexible substrate, such as, for example, a polyimide plastic sheet with or without an inorganic coating. Further, substrate 200 may be transparent. In at least one alternative embodiment, substrate 200 is both flexible and transparent, such as polyethylene teraphathalate (PET).

Conductive strips 202 may be provided by any number of different methods, such as, for example, depositing a metal film upon the substrate 200 and performing imprint lithography upon the metal film to define a plurality of parallel conductive strips 202. Briefly stated, an imprint polymer is used as a mask pattern for the conductive strips 202. The residual imprint material and then the exposed portion of the metal film are removed. The imprinted polymer is then removed, resulting conductive strips ready for subsequent device processing. In at least one embodiment, the conductive strips 202 are provided by such a method.

In an alternative embodiment, the parallel conductive strips 202 may be provided by a lift-off method. Generally summarized, imprint lithography is performed upon substrate 200. The residual imprint material is removed and a metal film is deposited upon the imprint structure and the substrate 200. By removing the imprinted structure (i.e. lifting-off the structure) the portion of the metal film upon the imprinted structure and thus above the substrate 200 is removed, thus providing a plurality of conductive strips upon the substrate 202. In the lift-off process the polymer used for the imprint structure is in effect used as a negative mask pattern for the desired conductive strips 202.

As is further shown in the enlarged section bounded by dotted line 204, in at least one embodiment the conductive strips (e.g., conductive strips 202A~202B) are evenly spaced. In addition, in at least one embodiment the width "Ws" of each conductive strip 202 is at least equal to the width "Wn" of the space, e.g., nano-gap 206, separating the conductive strips 202A and 202B. In at least one embodiment the width (Ws) of each conductive strip 202 is between about 1 to 5 µm with the width (Wn) of each nano-gap 206 therebetween equal to or less than the width of each conductive strip 202 (e.g., Ws≧Wn). Specifically, in at lest one embodiment Ws is between about 1 to 5 μm and Wn is between about 100 to 400 nm.

Figure 3:
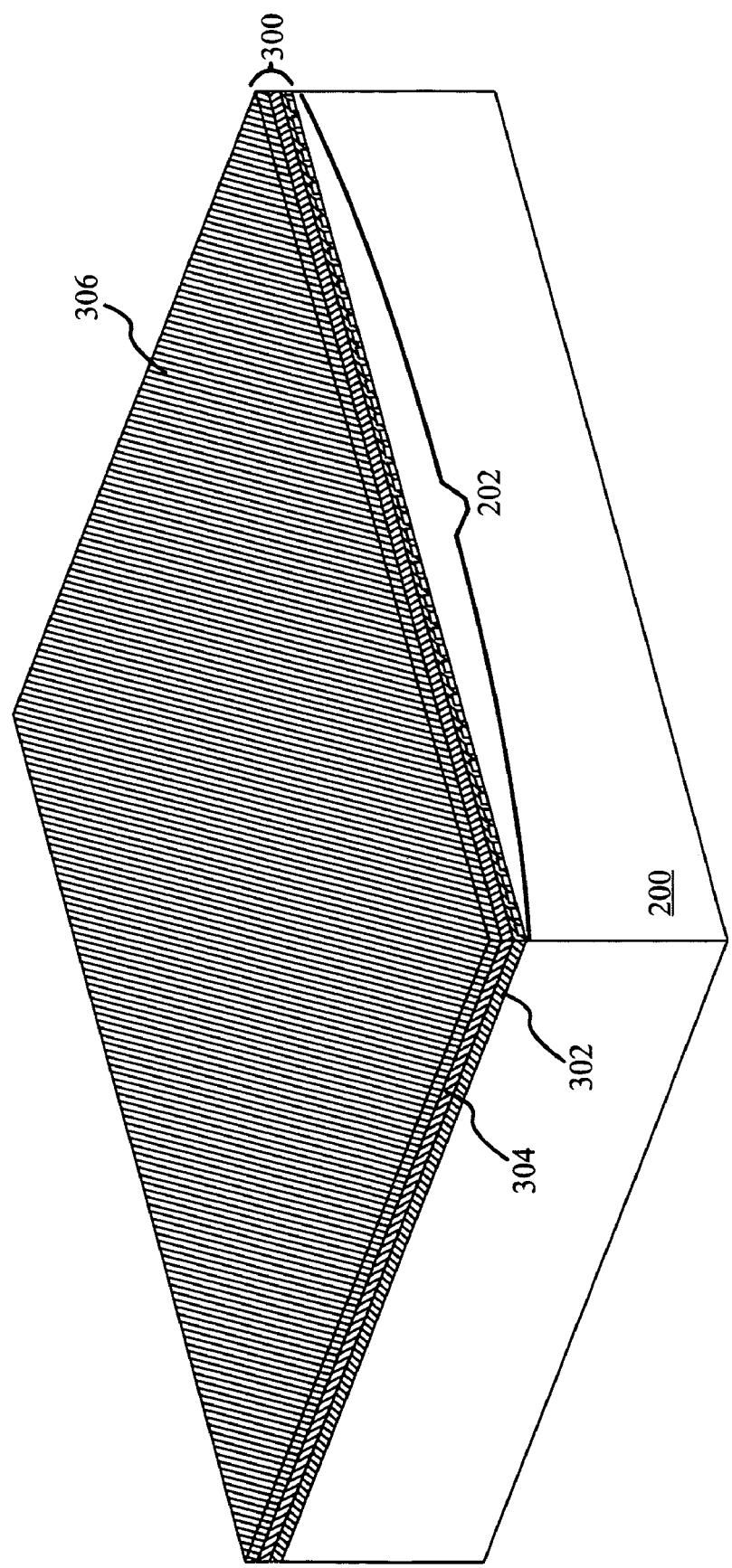
FIG. 3 is a perspective view of a plurality of thin film device layers deposited upon the conductive strips of FIG. 2 in accordance with an embodiment.

As shown in FIG. 3, a plurality of thin film layers are deposited upon the conductive strips 202 as a stack 300. In at least one embodiment, the stack 300 includes a dielectric layer 302, a semiconductor layer 304 and a top metal layer 306. Under appropriate circumstances, a contact layer (such as a doped semiconductor layer) may also be deposited so as to lay between the semiconductor layer 304 and the top metal layer 306. It is understood and appreciated that other pluralities of thin film layers may be deposited in place of, or in addition to the exemplary stack 300.

It is to be appreciated that the stack 300 of film layers does not provide a conductive layer (e.g., a doped semiconductor or metal layer) proximate to conductive strips 202, or more specifically, below the semiconductor layer 304. For TFT 1400 as fabricated the gate electrode 1408 is a segmented gate electrode and no conductive element is disposed between the gate electrode 1408 and the channel 1300.

Deposition of each material layer within stack 300 may be accomplished by vacuum deposition, gravure coating, sputtering, roll-to-roll deposition equipment, spin casting, ion beam deposition, electron beam evaporation, metal organic deposition (MOD), chemical vapor deposition (CVD) or such other method as is appropriate for the material being deposited. It is understood and appreciated that each material layer within stack 300 is deposited uniformly. Further, although each thin film layer within the stack 300 has been illustrated as a single layer, each may in actuality be established from multiple layers. Each thin film layer has been illustrated as a single layer for ease of discussion and illustration.

In at least one embodiment, the stack 300 of thin film layers is a stack of Silicon Nitride, Amorphous Silicon, N+ doped microcrystalline or amorphous Silicon and Aluminum. In embodiments where substrate 200 is transparent, and the resulting device is intended to be transparent or semi-transparent as well, transparent conductive materials such as Indium Tin Oxide may be used. Other transparent conductive and semiconductor materials may also be used, such as, for example, ZnO as well as certain organic and doped semiconductor materials. Transparent dielectrics such as, for example, SiN or $AL_2O_3$ may also be used.

Figure 4:
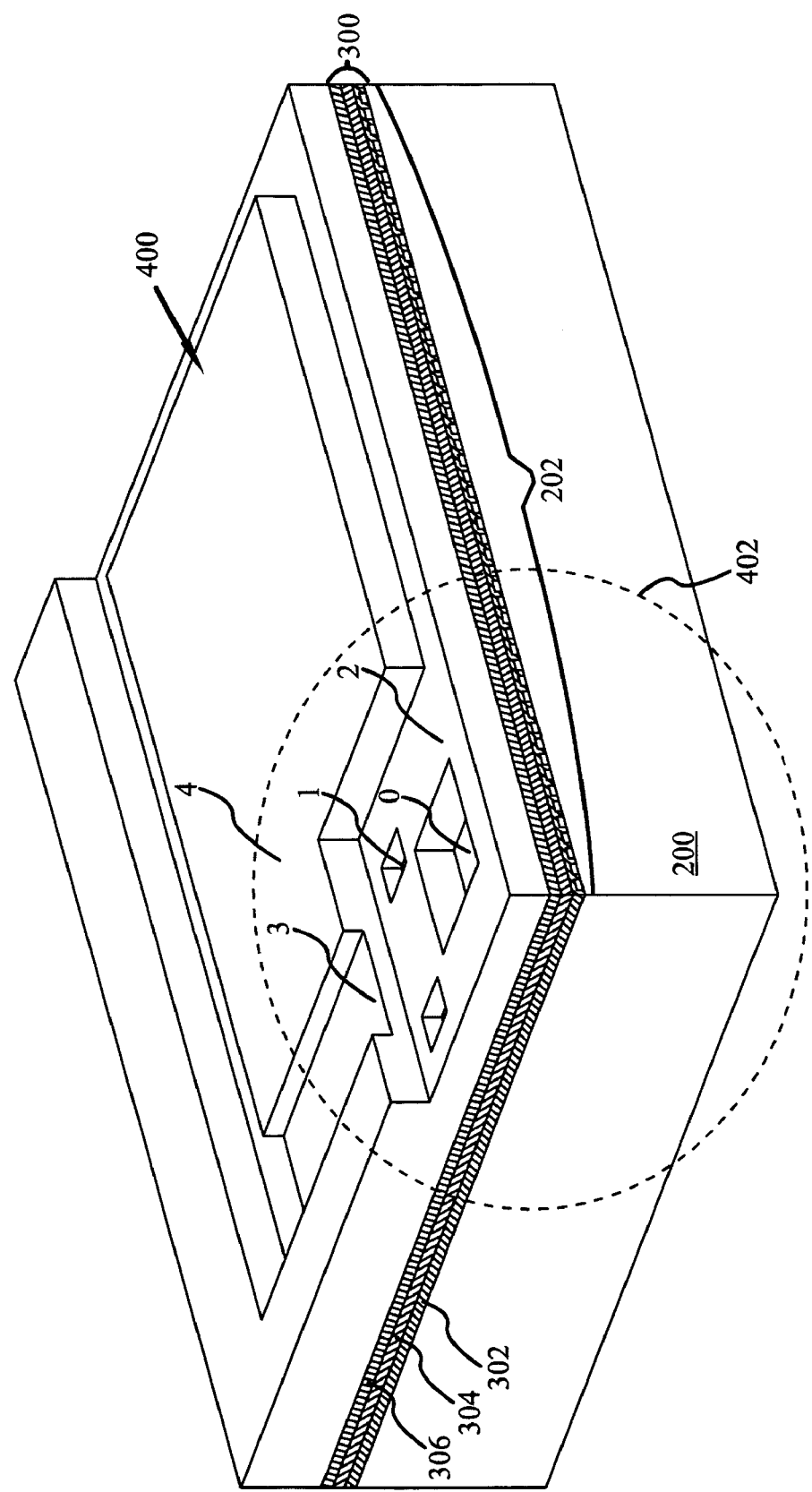
FIG. 4 is a perspective view of a 3D structure provided upon the stacked thin film device layers of FIG. 3 in accordance with an embodiment.

Shown in FIG. 4, a 3D structure 400 having a plurality of different vertical heights is provided upon stack 300. In at least one embodiment, a polymer, such as an imprint polymer or resist, is deposited upon the stack 300 and then imprinted by a stamping tool to provide 3D structure 400. The resist or polymer may incorporate any of a variety of commercially available polymers. For example, a polymer from the Norland optical adhesives (NOA) family of polymers could be used. A silicone material may also be used as is described in U.S. patent application Ser. No. 10/641,213 entitled "A Silicone Elastomer Material for High-Resolution Lithography", which is herein incorporated by reference.

A method for utilizing a stamping tool to generate a 3D structure in a layer of material is described in U.S. patent application Ser. No. 10/184,587 entitled "A Method and System for Forming a Semiconductor Device", which is herein incorporated by reference. A stamping tool is further described in U.S. patent application Ser. No. 10/903,300 entitled "Imprint Stamp", which is herein incorporated by reference. With further respect to roll-to-roll processing where substrate 200 may be of arbitrary size, yet another method for providing a 3D structure 400 is described in U.S. Pat. No. 6,808,646, entitled "Method of Replicating a High Resolution Three-Dimension Imprint Pattern on a Compliant Media of Arbitrary Size", which is also herein incorporated by reference.

Generally speaking, when employing a stamp and polymer, a stamping tool is brought into contact with the polymer, thereby displacing the polymer layer into the 3D pattern provided by the stamping tool. Typically, the displaced polymer is then cured, such as by UV light exposure, or any other suitable curing means.

It is further understood and appreciated, that 3D structure is described as having different vertical heights, the dimension of reference being normal to the substrate 200. As shown, in at least one embodiment, 3D structure 400 provides five levels of substantially different vertical heights, levels 0, 1, 2, 3 and 4. The source and drain electrodes will ultimately be defined in part by level 4 and the channel by level 3. The gate electrode will be defined by levels 0 and 1, and level 2 will establish device isolation. Under appropriate circumstances 3D structure 400 may be provided with greater or fewer vertical heights so as to provide different thin film devices separate from or in connection with the TFT as exampled herein.

Figure 5:
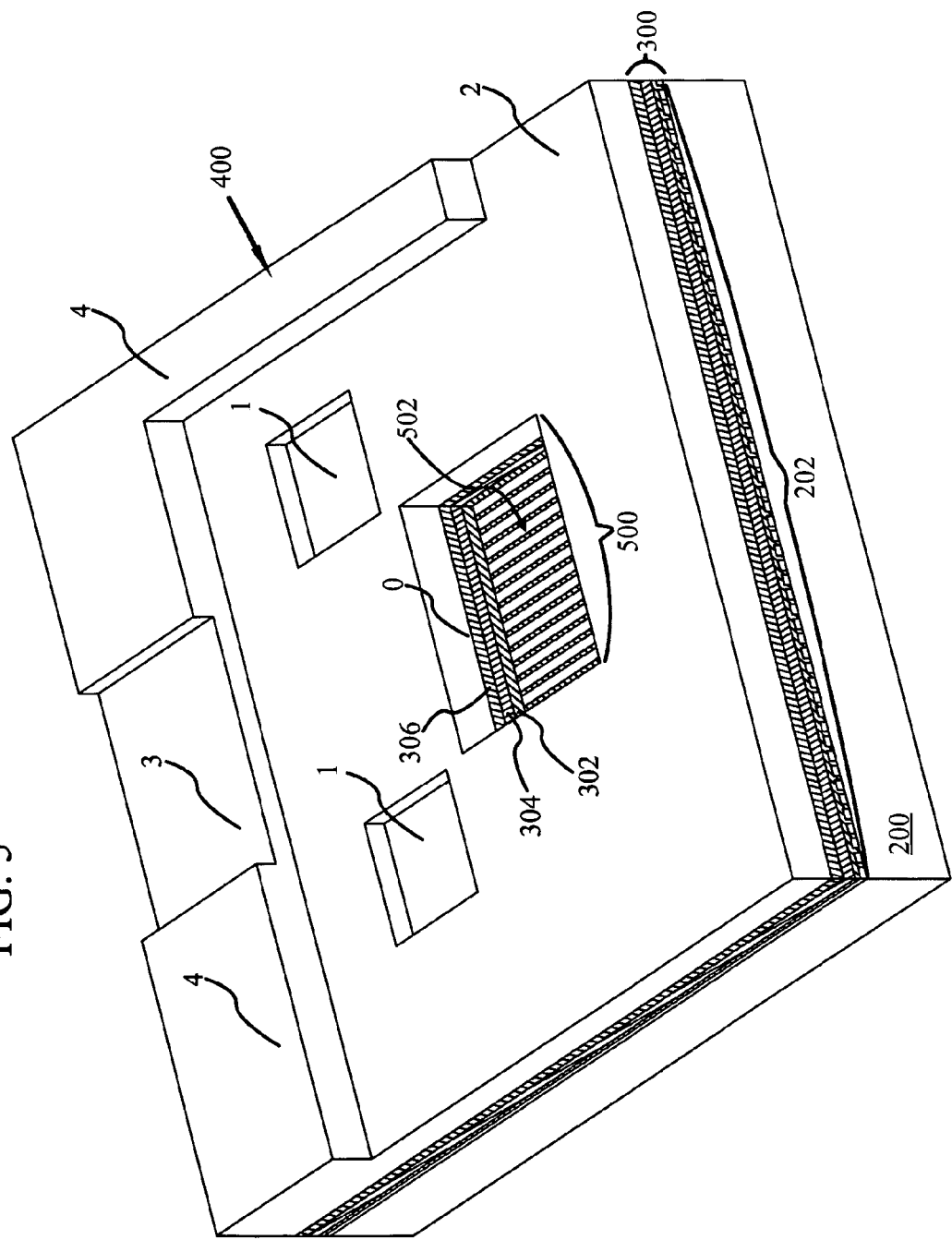
FIG. 5 is an enlarged perspective view of a portion of the developing structure shown in FIG. 4, showing the exposed conductive strips below the 3D structure in accordance with an embodiment.

FIG. 5 is an enlarged area corresponding generally to the area in FIG. 4 bounded by dotted line 402. As shown in FIG. 5, 3D structure 400 is then etched to effectively remove the structure material from the first lowest level, e.g., level 0, thereby establishing aperture 500. Aperture 500 exposes the topmost layer of stack 300. Etching is continued with appropriate etchants to remove successive layers from stack 300 and expose the conductive strips 202, specifically a first portion of conductive strips 502 lying beneath aperture 500. In at least one embodiment, the etching is accomplished by a reactive ion etching process (RIE).

It is generally understood that an ion etching process may be accomplished by either of two traditional processes—a physical process or an assisted physical process. In a physical etching environment, no chemical agent is provided. Rather, the removal of material is entirely dependent upon the physical impact of the ions knocking atoms off the material surface by physical force alone. Physical ion etching is commonly referred to as ion milling or ion beam etching. Physical ion etching is also typically referred to as a dry process. A physical etching process is typically very anisotropic.

In an assisted physical process such as a reactive ion etching (RIE) process, removal of material comes as a combined result of chemical reactions and physical impact. Generally, the ions are accelerated by a voltage applied in a vacuum. The effect of their impact is aided by the introduction of a chemical which reacts with the surface being etched. In other words, the reaction attacks and removes the exposed surface layers of the material being etched.

The reactive ion etching process may have a high selectivity of etching one material over other materials. For example, oxygen plasma may have a high etch selectivity of polymer over silicon or metal materials. In other words, an RIE process advantageously permits accurate etching of one or more material layers with little appreciable effect upon other material layers. Moreover, RIE permits selective etching to remove specific layers (e.g., dielectric layer 302, semiconductor layer 304 and top metal layer 306) so as to expose the first portion of conductive strips 502. Further, the removal of these specific layers is substantially limited to the area defined by 3D structure 400 at level 0.

Figure 6:
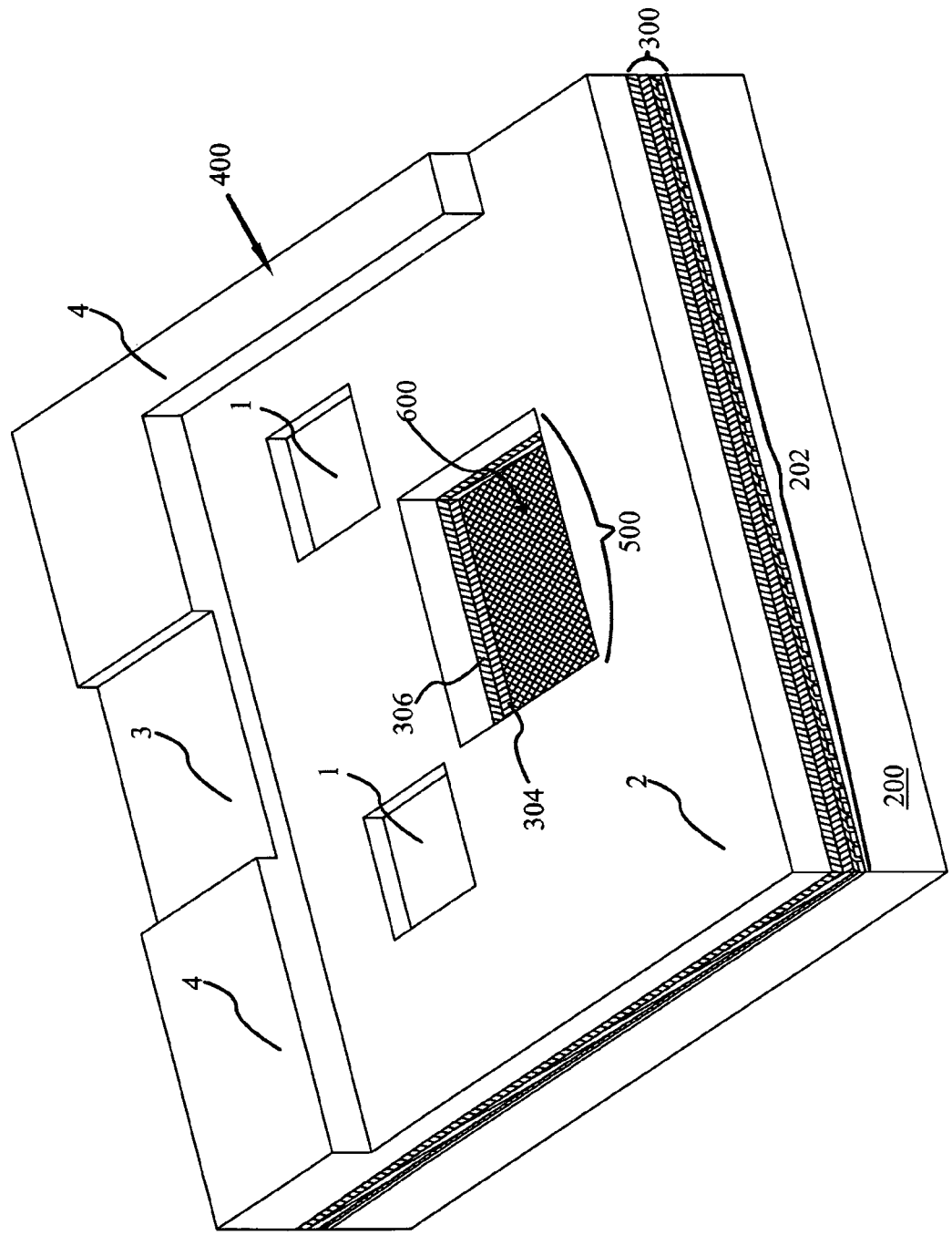
FIG. 6 is a perspective view showing a conductive pad provided upon the conductive strips shown in FIG. 5 in accordance with an embodiment.

FIG. 6 illustrates a conductive pad 600 that is provided upon the exposed first portion of conductive strips 502 shown in FIG. 5. In at least one embodiment, conductive pad 600 serves as a bridge conductor, bridging between conductive strips 502 so as to insure that each of the conductive strips 502 passing beneath 3D structure 400 level 3, defining the channel, are at substantially about the same voltage. As will be further discussed and describe below, conductive pad 600 also serves in part to insure proper alignment of the gate control (conductive strips 502) to the channel.

Conductive pad 600 may be provided by a number of different techniques. In the case of at least one embodiment, where the conductive strips 202 are fabricated from a material containing chrome, the chrome may be used as a seed layer in a electroplating or electroless plating operation. As the first portion of conductive strips 502 are only exposed in aperture 500, occurring where the initial 3D structure 400 level was 0, the formation of a conductive pad 600 is limited to the desired area.

In at least one alternative embodiment, conductive pad 600 is provided with the use of an ink-jet device providing a semi-fluid conductive material to aperture 500. A fabrication process incorporating such a device and applicable for roll-to-roll fabrication processes is set forth in U.S. patent application Ser. No. 11/062,384 entitled "A Method For Forming an Electronic Device", which is herein incorporated by reference.

Figure 7:
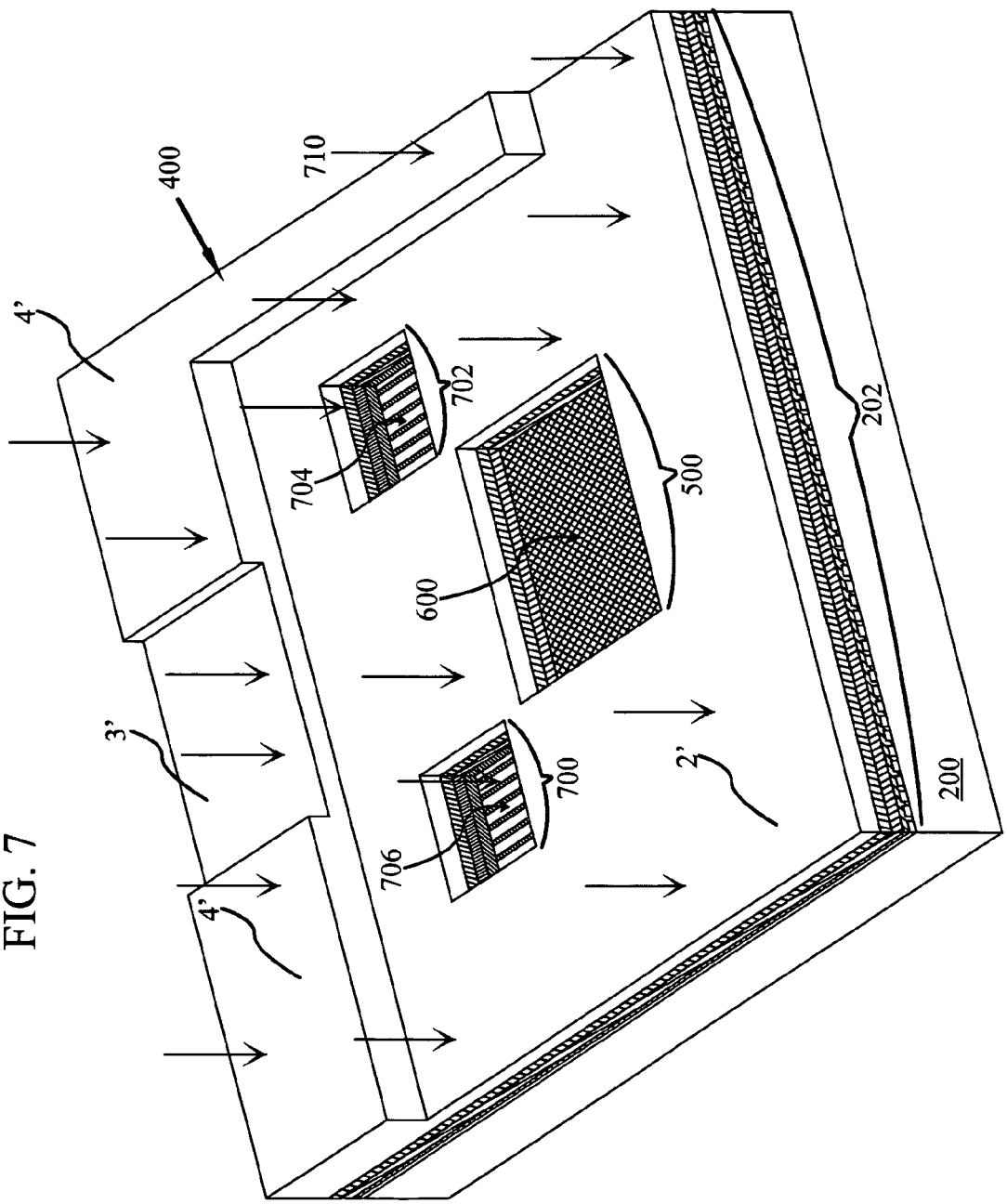
FIG. 7 is a perspective view illustrating an etching process to reduce the height of the 3D structure and expose a second area of conductive strips in accordance with an embodiment.

With respect to FIG. 7, the height of 3D structure 400 is reduced by the height of one level. In at least one embodiment, such a reduction in height is accomplished by etching, represented by arrows 710, thus reducing all remaining levels by a uniform amount. In other words, the 3D structure 400 is etched to remove the second lowest layer, e.g., level 1. Removal of the polymer material at level 1 creates apertures 700, 702 that expose stack 300. As with aperture 500, etching processes are continued to expose at least one second portion of conductive strips 704, 706. The use of selective etchant in an RIE process permits selectively etching substantially only the materials desired.

Figure 8:
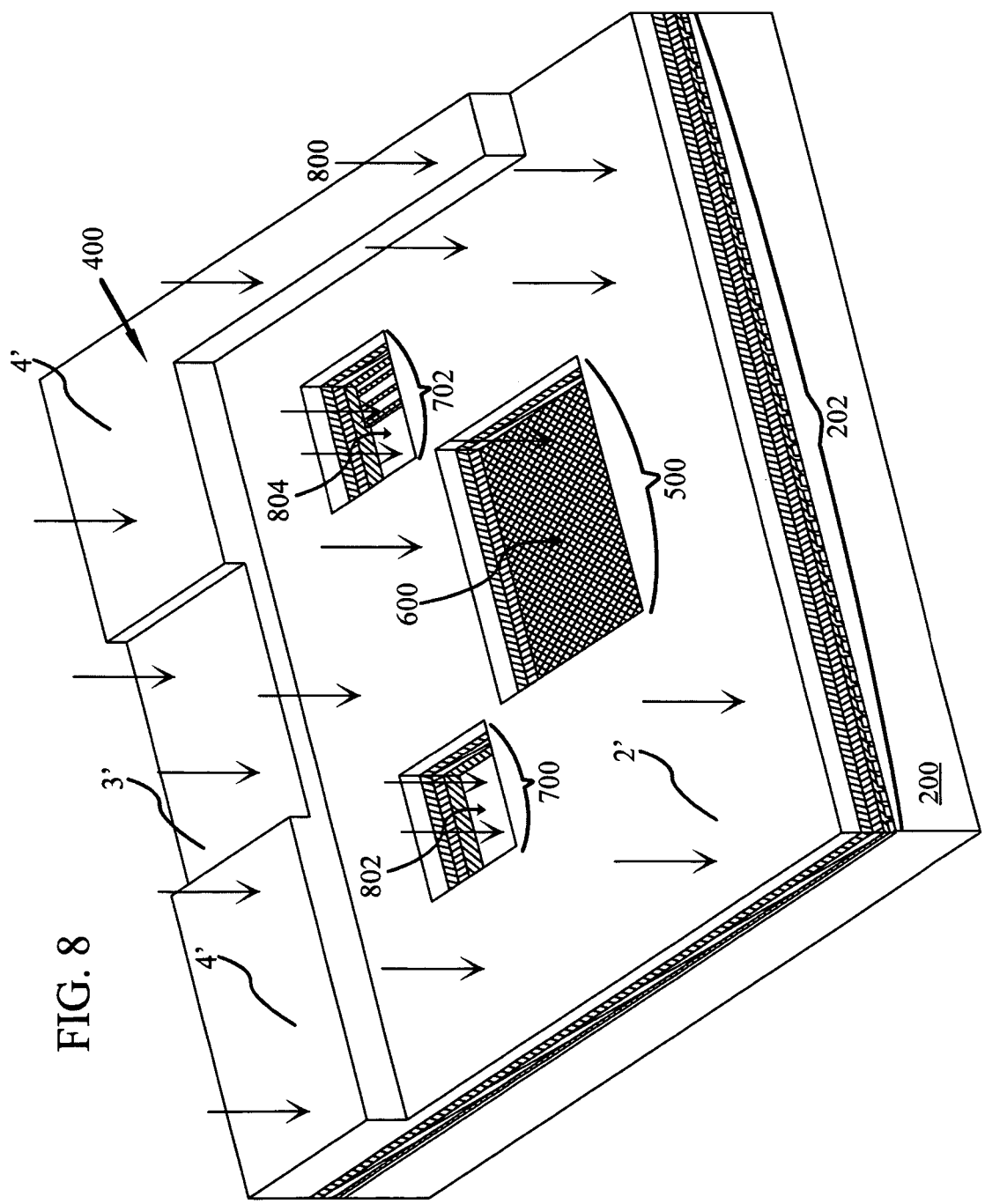
FIG. 8 is a perspective view illustrating an etching process to provide cut off vias in accordance with an embodiment.

As illustrated in FIG. 8, the exposed second portions of conductive strips 704, 706 are severed. In at least one embodiment, this is accomplished by performing a further RIE process, as illustrated by arrows 800. Where conductive strips 202, and specifically second portions of conductive strips 704, 706 are formed from chrome material, the exposed second portions of conductive strips 704, 706 may be etched in a Cr etchant such as CR-7s made by Cyantek.

In other words, as the etchant is selective for the material forming the conductive strips 202, the exposed second portions of conductive strips 704, 706 are removed while the other materials are not significantly etched or otherwise removed as the etching, represented by arrows 800, is performed across the surface. Cut-off vias 802, 804 are thus established adjacent to the conductive strips below conductive pad 600, and more specifically, the conductive strips that run beneath 3D structure 400 level 3', the area that will ultimately define the channel of the TFT device.

Figure 9:
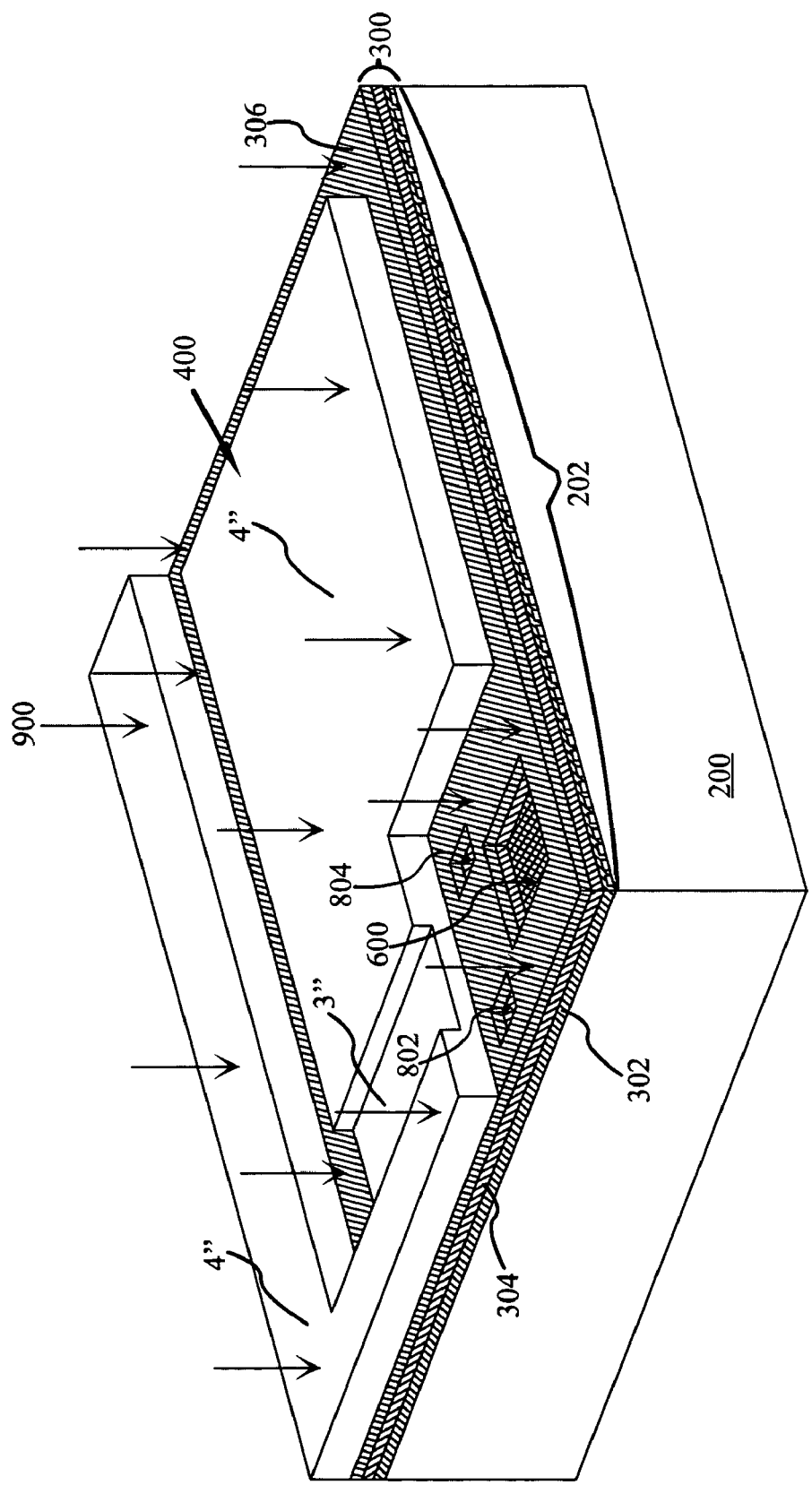
FIG. 9 is a perspective view similar to FIG. 4 showing an etching process to reduce the height of the 3D structure and expose portions of the thin film device layers in accordance with an embodiment.
Figure 10:
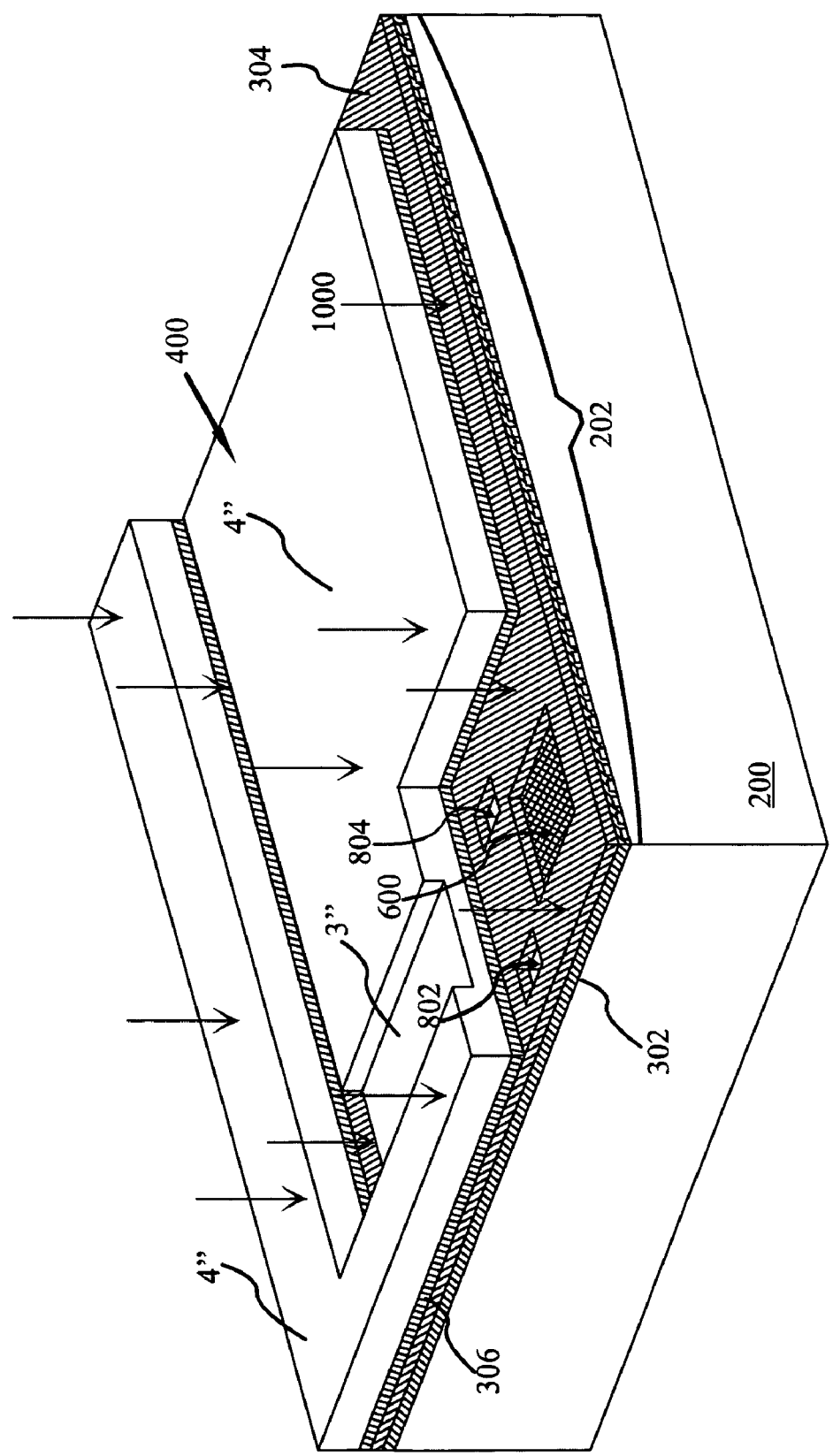
FIG. 10 is a perspective view showing an etching process to remove portions of the exposed thin film device layers shown in FIG. 9 in accordance with an embodiment.

FIGS. 9 and 10 return to the perspective view showing a greater portion of the developing TFT device. As indicated in FIG. 9, the height of 3D structure 400 is again reduced by a height of one level. In at least one embodiment, such a reduction in height is accomplished by etching, shown as arrows 900, thus reducing all remaining levels by a uniform amount. Moreover, the 3D structure 400 is etched to remove the third lowest level. 3D structure 400 now remains at levels 3" and 4", while the remaining material at level 2' had been removed, thus exposing the top of stack 300. As illustrated, areas of top metal layer 306 are now exposed.

As in FIG. 10, an RIE process is again performed, illustrated as arrows 1000, to substantially remove the exposed portions of top metal layer 306. The remaining 3D structure 400 at levels 3" and 4" serve to define areas of top metal layer 306 that will eventually serve as the source electrode, drain electrode and data line.

Figure 11:
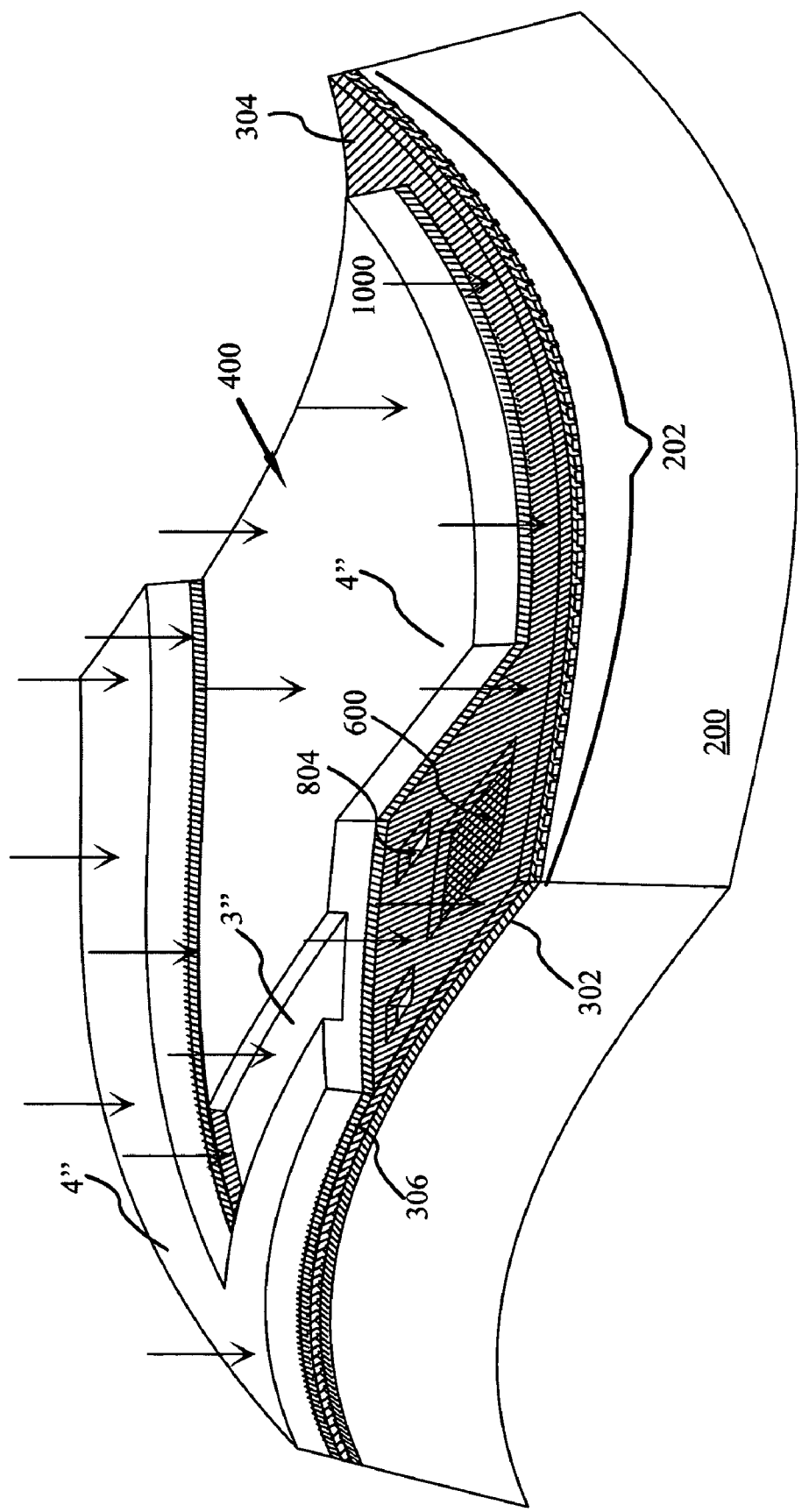
FIG. 11 is a perspective view illustrating the advantageous nature of the fabrication process to tolerate distortion in accordance with an embodiment.

Traditional lithographic processes such as photolithography involve the deposition of a layer, subsequent 2-D masking, and etching, and cannot tolerate substrate distortion without undermining the functionality of the intend device. FIG. 11 illustrates the highly advantageous nature of the SAIL process to effectively provide alignment with respect to each level of the 3D structure, the stack 300 of thin film layers, and the substrate, without respect to distortions.

Figure 12:
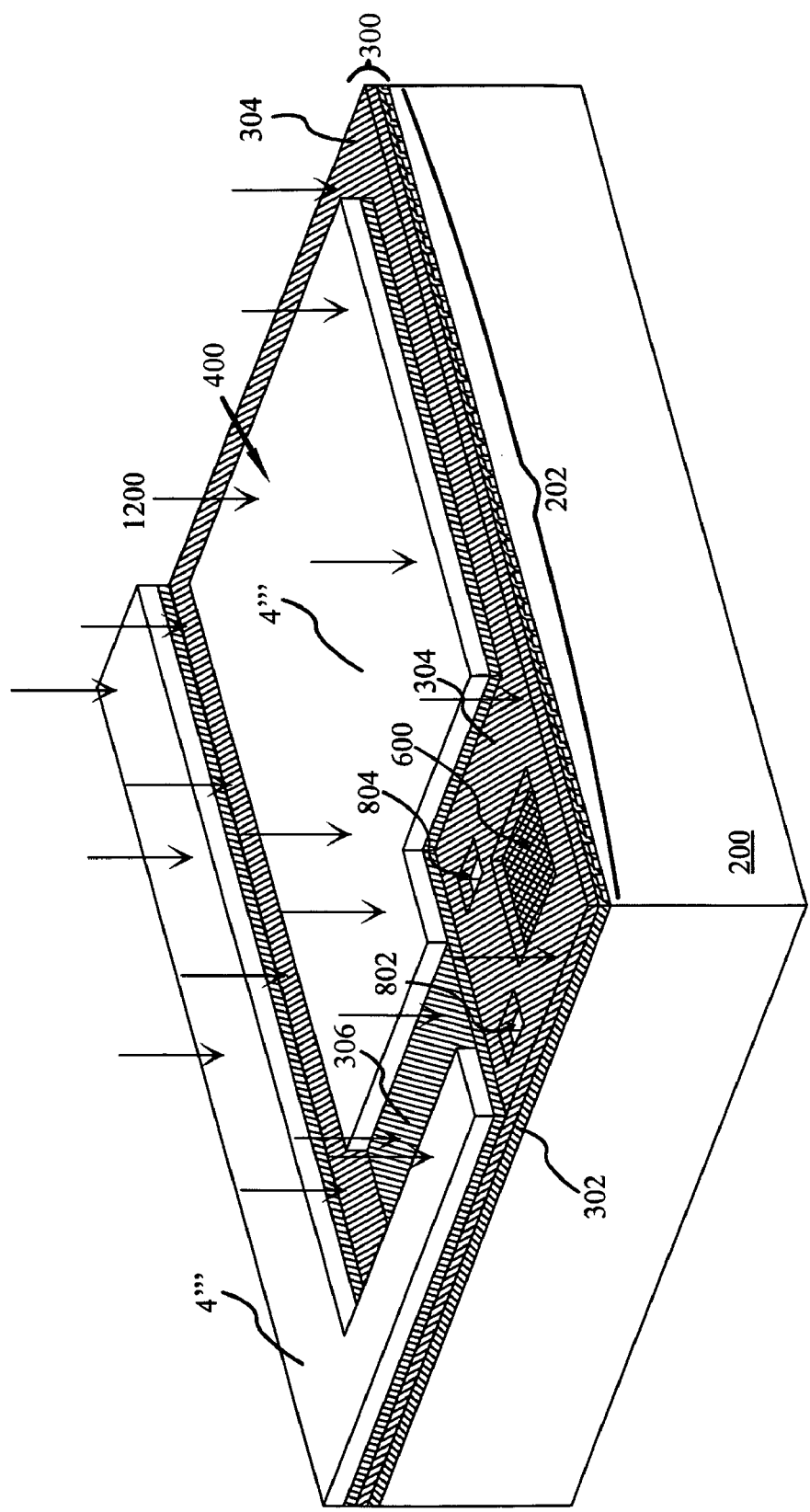
FIG. 12 is a perspective view showing an etching process to reduce the height of the 3D structure shown in FIG. 10 and expose portions of the thin film device layers in accordance with an embodiment.

As in FIG. 12, the height of 3D structure 400 is again reduced by a height of one level. In at least one embodiment, such a reduction in height is accomplished by etching, shown as arrows 1200, thus reducing all remaining levels by a uniform amount. Moreover, the 3D structure 400 is etched to remove the fourth lowest level. As such, stack 300 is exposed above, and in line with, the first portion of conductive strips passing beneath conductive pad 600 and bounded by cut off vias 800, 802.

The remaining portion of 3D structure 400 is now only 4''', which continues to protect and define the portions of top metal layer 306 that will form the source and drain electrodes. As level 3" has been removed, top metal layer 306 is exposed in an area that will provide the channel.

Figure 13:
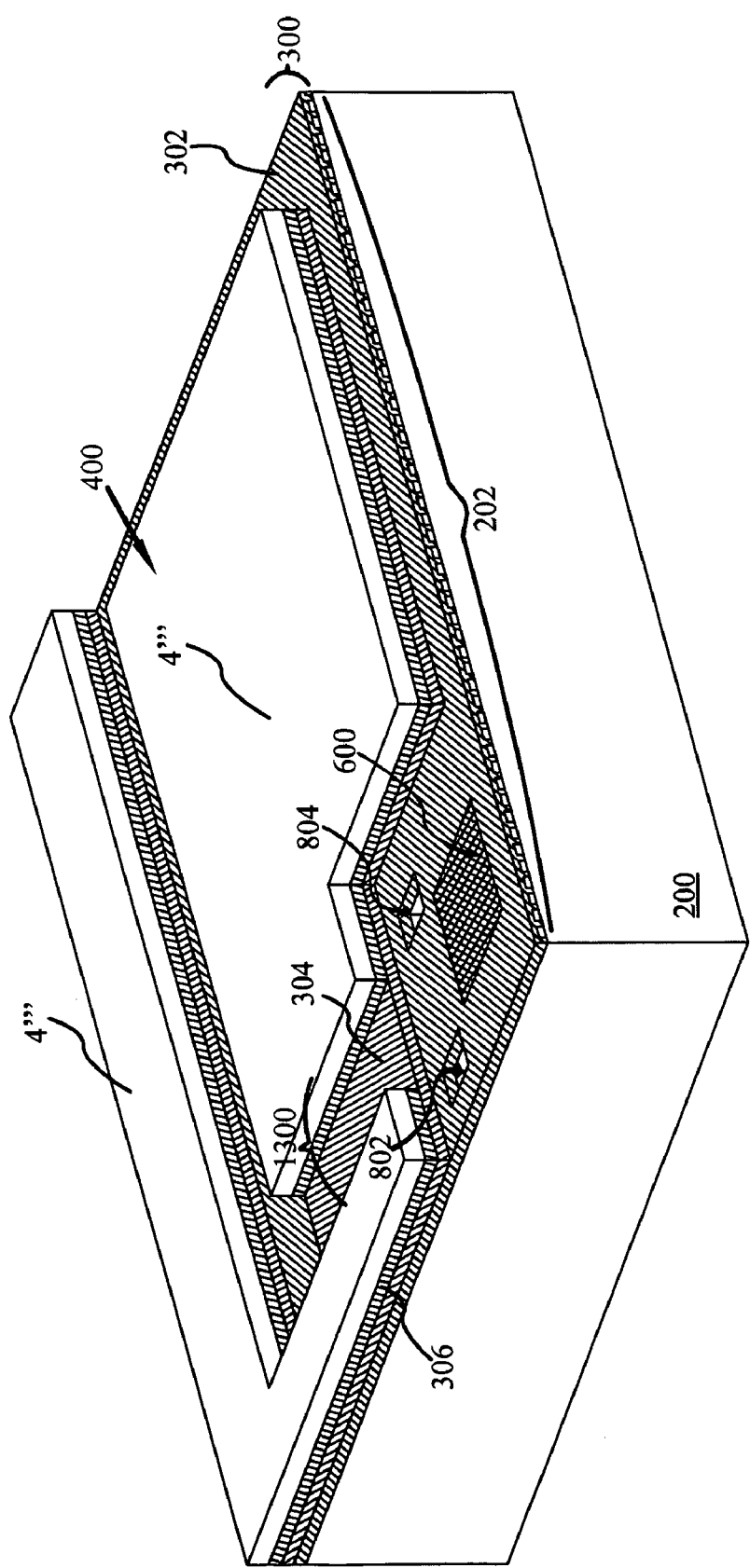
FIG. 13 is a perspective view showing the established channel provided by etching the structure as shown in FIG. 12 in accordance with an embodiment.

In FIG. 13, exposed portion of the top metal layer 306 of stack 300 has been removed to establish channel 1300. In addition, in at least one embodiment, the exposed portions of other stack layers (e.g., semiconductor layer 304) have been removed to expose portions of dielectric layer 302. Where RIE processes are involved, typically the semiconductor layer 304 is etched before the exposed top metal layer 306 is etched, the exposed portion of top metal layer 306 serving to protect and define the portion of semiconductor layer 304 that will define channel 1300.

Figure 14:
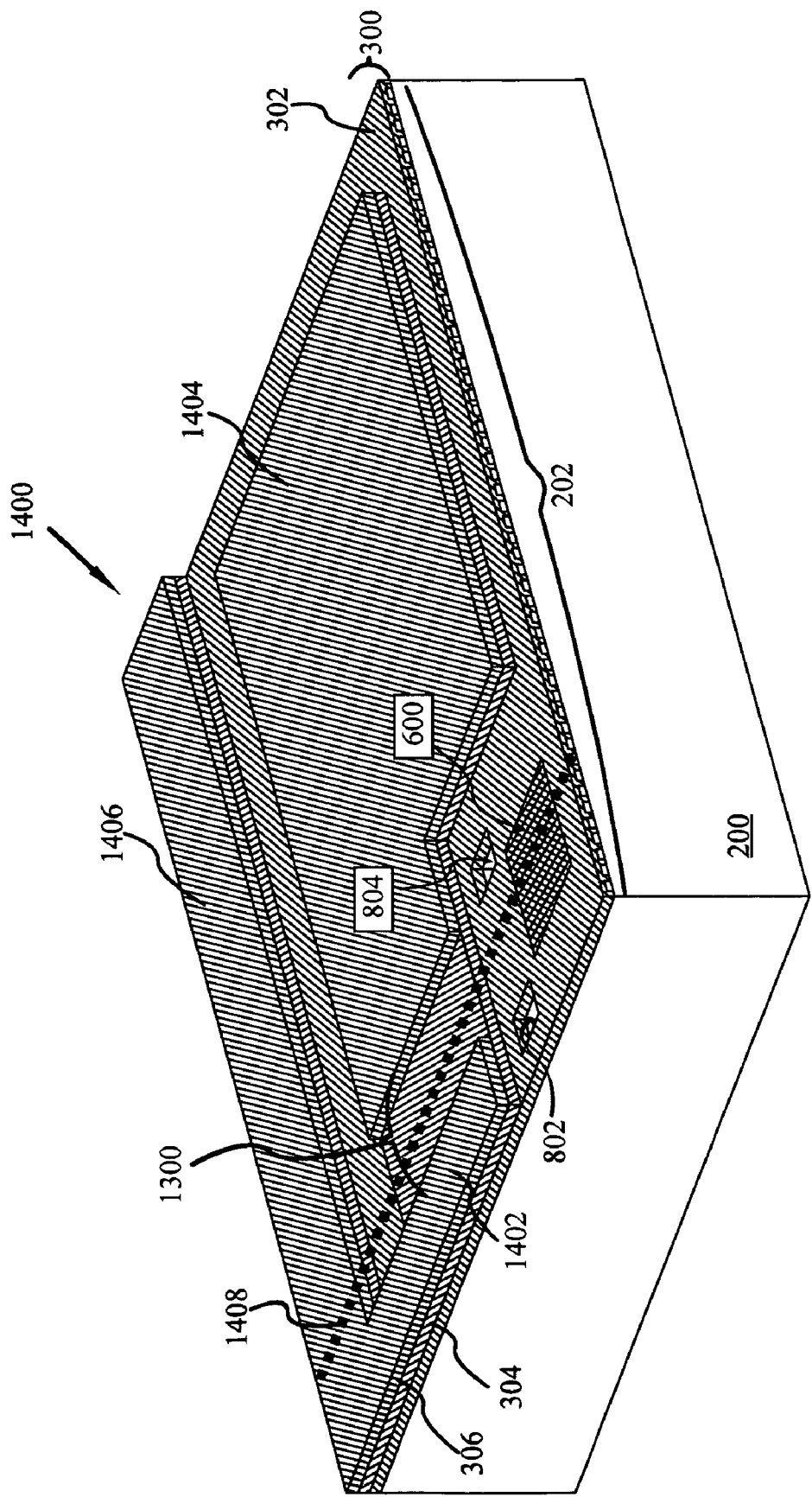
FIG. 14 is a perspective view of the established TFT device in accordance with an embodiment.

As shown in FIG. 14, the remaining portions of 3D structure 400 may be removed. A bottom-gate TFT 1400 with nano-gaps in the gate electrode may now be fully appreciated. As shown there is a source electrode 1402, a drain electrode 1404, a data line 1406 joined to the source electrode 1402, a channel 1300, and a gate (illustrated as a dotted line 1408) disposed below the channel 1300.

Figure 15:
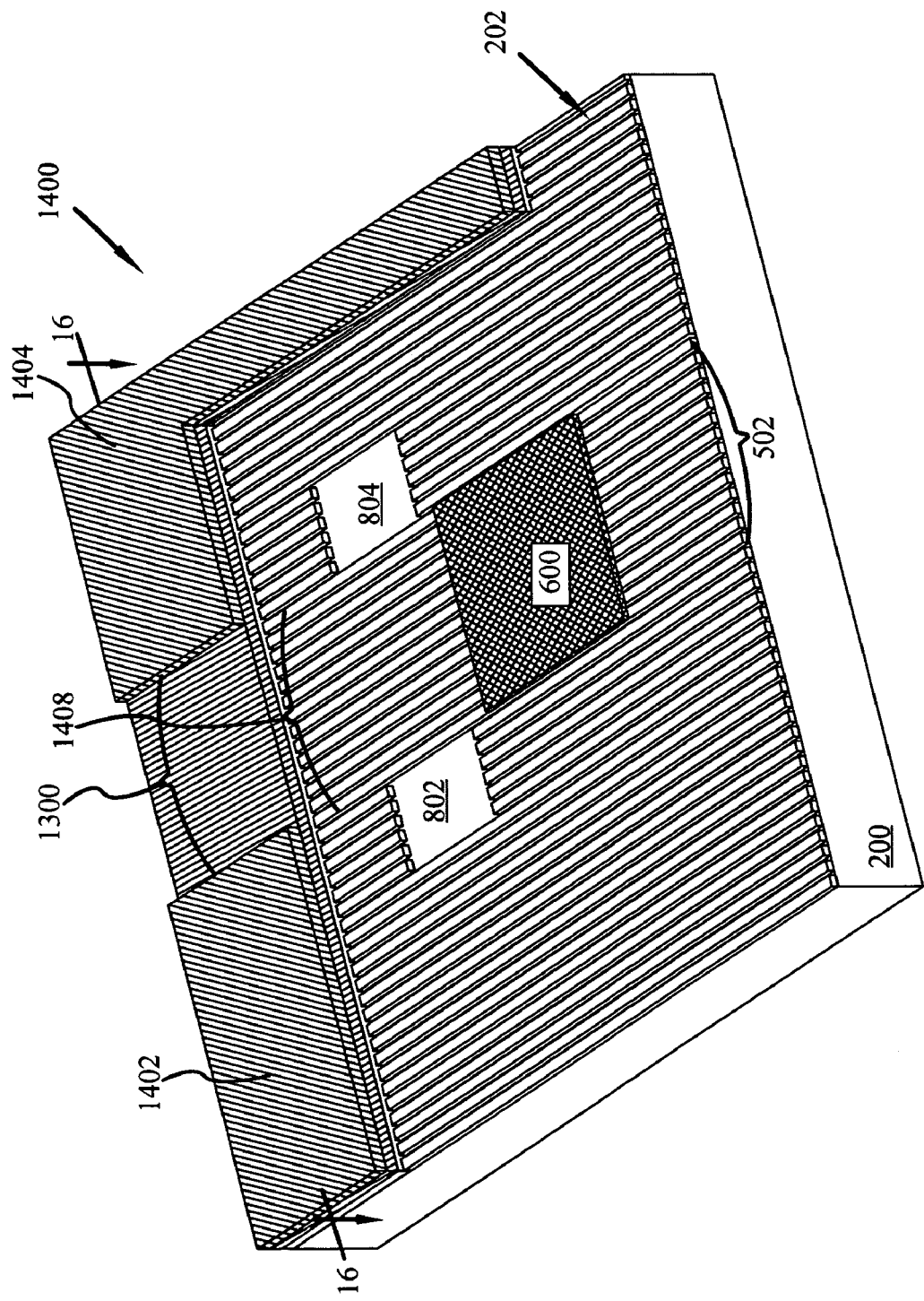
FIG. 15 is an enlarged partial cut away view of the established TFT device in FIG. 14 in accordance with an embodiment.
Figure 16:
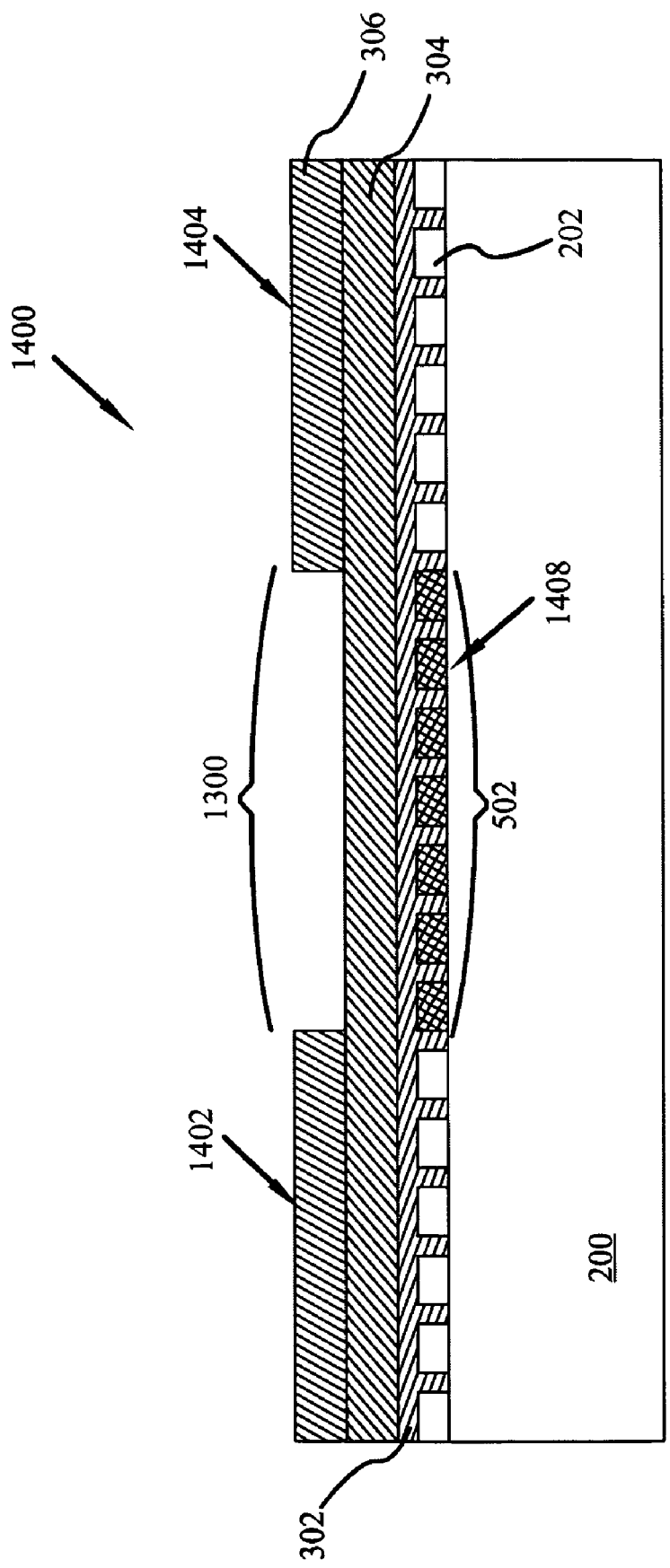
FIG. 16 is a side view cut away of the structure shown in FIG. 15 in accordance with an embodiment.

The arrangement of the source, drain, channel and gate, as composed of conductive strips 202, may be more fully appreciated in the enlarged partial cutaway portion presented in FIG. 15, and plane midsection view presented in FIG. 16. As shown, gate 1408 is provided by a plurality of parallel spaced electrically conductive strips 202 upon substrate 200. More specifically, channel 1300 is disposed above at least a portion of the conductive strips 202.

As shown, the channel 1300 is disposed above the first plurality of conductive strips 502. In addition, and as is clearly illustrated in FIG. 16, no conductive element such as for example a doped semiconductor or metal layer is disposed between the segmented gate 1408 provided by the first plurality of conductive strips 502 and channel 1300. The channel 1406 is also substantially transverse to the conductive strips 202. Cut-off vias 800, 802 are aligned with the edges of the channel 1300 (not shown in FIG. 16).

As the physical structure of the TFT 1400 is established by the 3D contour of 3D structure 400 provided by an imprinting process, there is minimal overlap between the source/drain electrodes 1402, 1404 and the gate 1408. More specifically, in at least one embodiment, there is no appreciable overlap between the source, drain and gate electrodes 1402, 1404, 1408.

Moreover, the alignment of the source, drain and gate electrodes 1402, 1404, 1408 is established very early on in the fabrication process and is not subject to skew or later misalignment as occurs with traditional lithographic processes. As such, TFT 1400 advantageously minimizes parasitic capacitance.

In a typical TFT, the gate electrode is a solid conductor, a structure that may be viewed as having no nano-gaps. The channel current is controlled by both the vertical (perpendicular to the channel surface) as well as the lateral (source—drain direction) electrical field. For an n-channel TFT, when a positive voltage is applied to the gate electrode, there is an electrical field in the vertical direction established in the channel.

Figure 17:
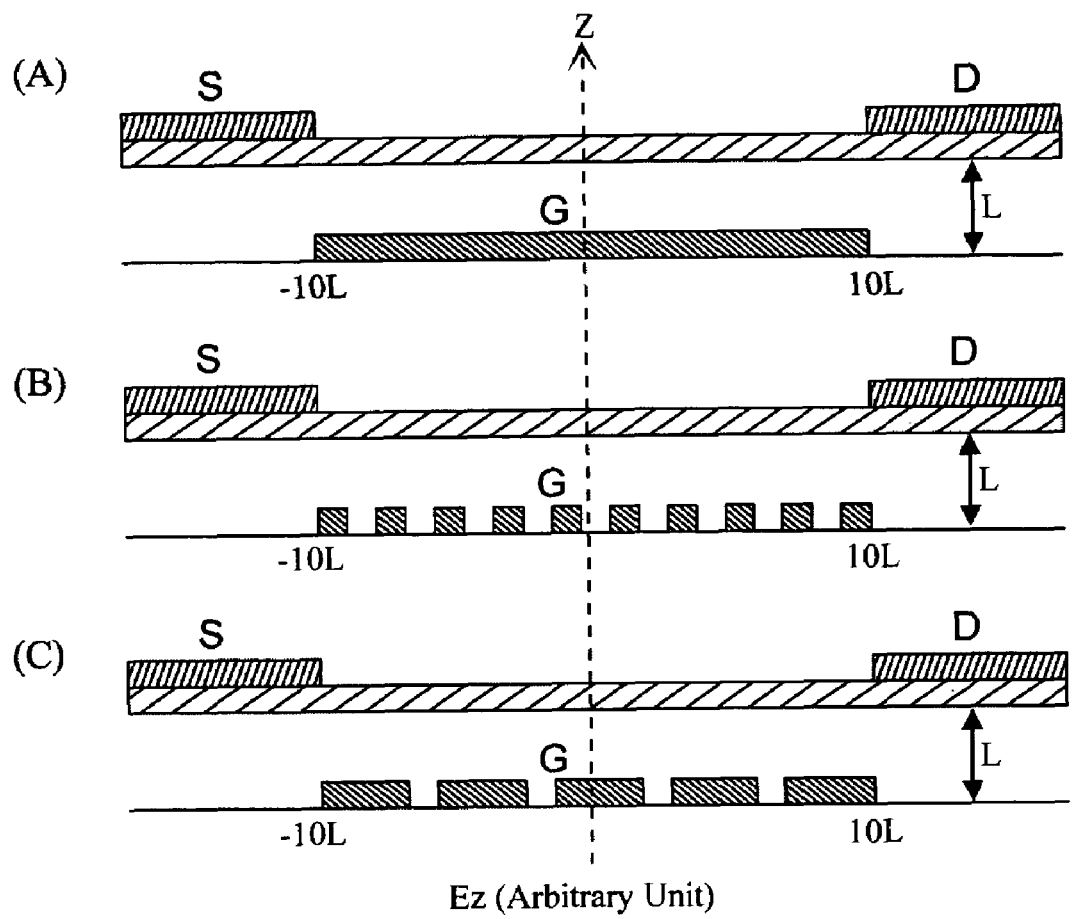
FIG. 17 provides graphical simulation data regarding the performance of TFT devices with nano-gaps in the gate conductor.
Figure 17:
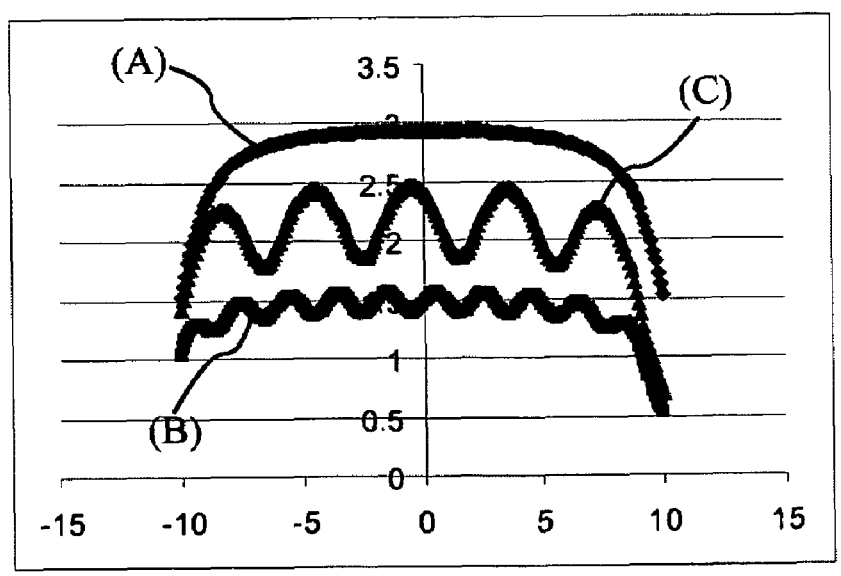

The vertical field induces electron carriers accumulated in the channel. The amount of induced charges is proportional to the strength of the vertical field. The channel current is related to the amount of induced charges in the channel and the lateral field. FIG. 17 illustrates simulation results of the field strength of the vertical component for three different gate electrodes: (A) a solid electrode; (B) a gate electrode consisting of ten segments with three hundred nm width and three hundred nm nano-gap spacing therebetween; and (C) a gate electrode consisting of five segments with nine hundred nm width and three hundred nm nano-gap spacing therebetween.

When working with two parallel conductors, the field strength of the vertical component is uniform in the middle portion. The field strength at the edge (e.g., the fringe field/edge field effect) of the parallel conductors is generally about half of what is present in the middle portion. When the gate conductor is subdivided into smaller elements cooperatively acting as a larger gate electrode, there is a reduction of the field strength depending upon the ratio of conductive strip width and the width of the nano-gaps for a given dielectric thickness.

As a direct result of the nano-gap gate configuration, there will be less charge accumulation resulting in less device on-current. Therefore, compared with a conventional TFT, the source drain current will be reduced by the proportion of the total accumulated width of the nano-gaps versus the total accumulated width of the conductive strips providing the gate electrode. However, if the ratio between the width of the conductive strips and the nano-gaps is large enough, the current reduction can be insignificant for device performance. More specifically, this reduction can be compensated for by increasing the channel width to supply the current required by the application intended for the device.

As in the fabrication process shown and described above with respect to FIGS. 1~14, and the fabricated device shown in FIGS. 14~16, 18 and 19, it is to be understood and appreciated that there is no conductive element such as a doped semiconductor or metal conductor coupled to the channel above the segmented gate electrode. Moreover, there is no additional conductive element disposed in vertical alignment between the segmented gate 1408 and channel 1300 (see FIG. 16). TFT 1400 is therefore structurally different from multi-gate transistors as they employ a conductive element coupled to the channel that spans the multi-gate elements.

Moreover, TFT 1400 relies on fringe field and carrier diffusion to allow the electric carriers in the channel to conduct across the gap. This is functionally different from a multi-gate transistor as a traditional multi-gate transistor relies on connecting the source of one transistor the drain of a neighboring transistor to establish the channel current. Moreover a multi-gate transistor typically functions as a series of smaller, single. gate transistors cooperatively working as a collective whole.

As stated above, in at least one embodiment, the assembled TFT 1400, and more specifically the array of assembled TFT devices, are flexible. Use of individual conductive strips may further facilitate ease of flexibility. As the conductive strips are provided before the stack of thin film layers and 3D structure are provided, as discussed above, these is a possibility for the skew between the conductive strips providing the gate control and the channel.

Figure 18:
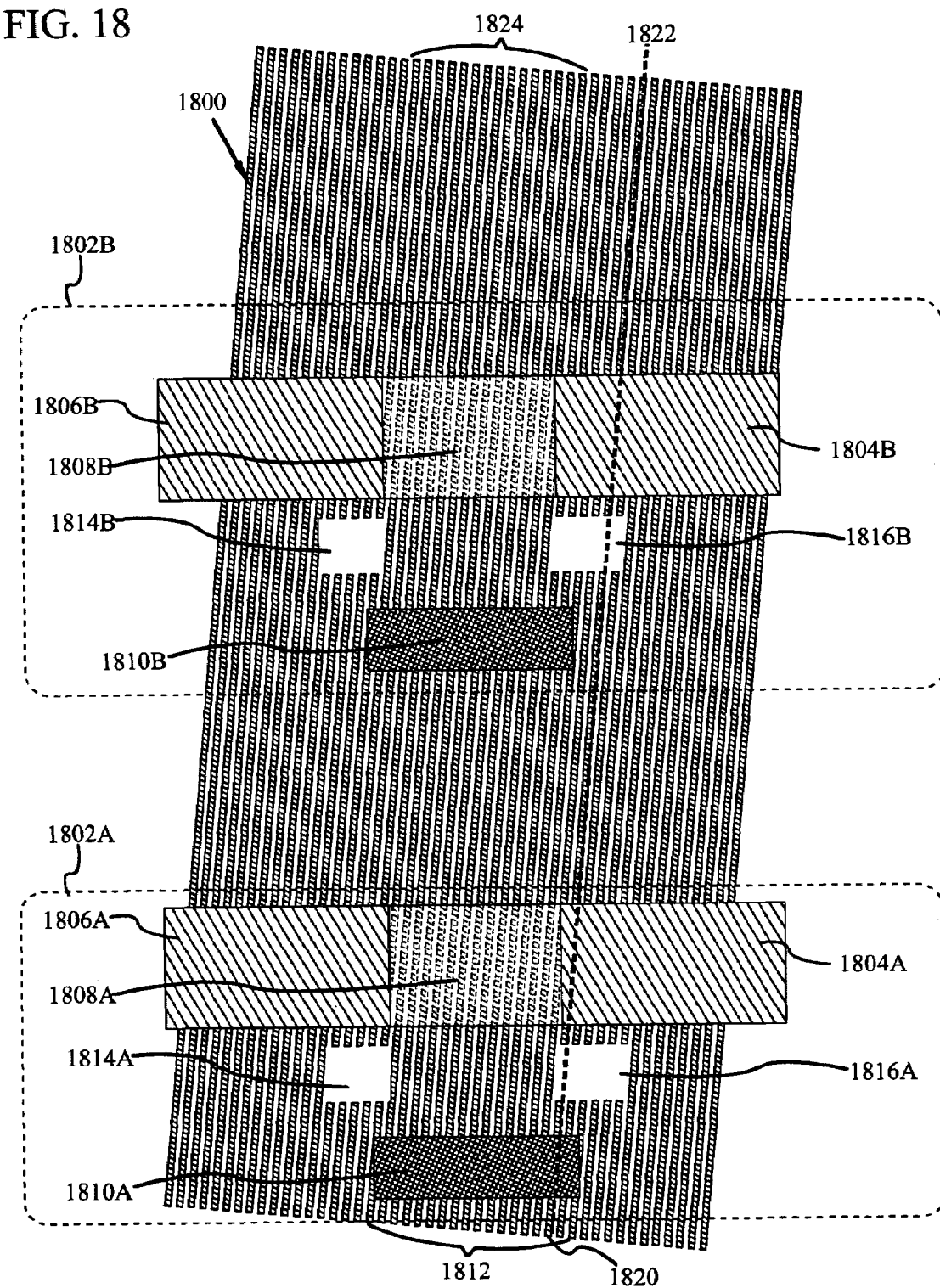
FIG. 18 illustrates the gate to channel re-alignment properties of the TFT device in accordance with an embodiment.

FIG. 18 illustrates the advantageous re-alignment properties inherent to TFT 1400. More specifically, FIG. 18 is a partial top view showing a plurality of conductive strips 1800, substantially identical to those conductive strips discussed and described above. Formed upon the conductive strips are two TFT devices, 1802A, 1802B. With respect to TFT device 1802A, a drain electrode 1804A and source electrode 1806A are aligned to a channel 1808A. Conductive pad 1810A commonly connects a subset 1812 of conductive strips that are aligned to pass beneath channel 1808A. Cut-off vias 1814A, 1816A are aligned to channel 1808A and thus interrupt the conductive strips 1800 on either side of channel 1808A.

As illustrated, the conductive strips 1800 are not 90 degree transverse to the channels 1808A, 1808B. The skew has been exaggerated for ease of illustration and discussion. As shown, conductive strip 1820 is a member of subset 1812, running beneath conductive pad 1810A. As illustrated by dotted line 1822, conductive strip 1820, if un-interrupted, would pass just to the right of channel 1808A, and would be significantly under drain 1804B—conditions that would result in significant parasitic capacitance. Cut off via 1816A prevents this from occurring.

Moreover, subset 1812, although acceptable to channel 1808A, is not acceptable to channel 1808B. Conductive pad 1810B and vias 1814B, 1816B serve to realign each gate control to each channel. In other words, the gate control provided by subset 1812 for channel 1808A is shifted slightly to subset 1824 as an aligned gate control for channel 1808B.

With respect to FIG. 18, it is also to be appreciated that conductive pad 1810A is at least as wide as channel 1808A, and may be wider. As shown, cut-off vias 1814A, 1816A insure that a gate control of proper width is provided beneath channel 1808A. Although skew may permit some instance of overlap and/or gap which may generate parasitic capacitance, such overlap and/or gap is advantageously limited to one conductive strip 1800 on either side of the channel 1808A. Thus, in the event of a gap and/or overlap, the parasitic capacitance is advantageously minimized.

Moreover, the use of the parallel spaced conductive strips to provide the gate conductor and a SAIL process to define the overall structure and relationship between components of TFT 1400 permits the fabrication of TFTs on a smaller scale then is possible with traditional photo-lithographic techniques. With respect to the exampled TFT 1400, such high resolution permits the establishment of a high quality channel. Channel length and uniformity are important factors in determining TFT performance.

In at least one embodiment, the method of forming at least one TFT 1400 with nano-gaps in the gate electrode is performed as a roll-to-roll process, also referred to as web processing. In roll-to-roll processing, the substrate 200 (and resulting layered structure) may be several meters wide and several meters long. Roll-to-roll process is therefore an advantageous method when fabricating large devices such as backplanes for video displays.

Figure 19:
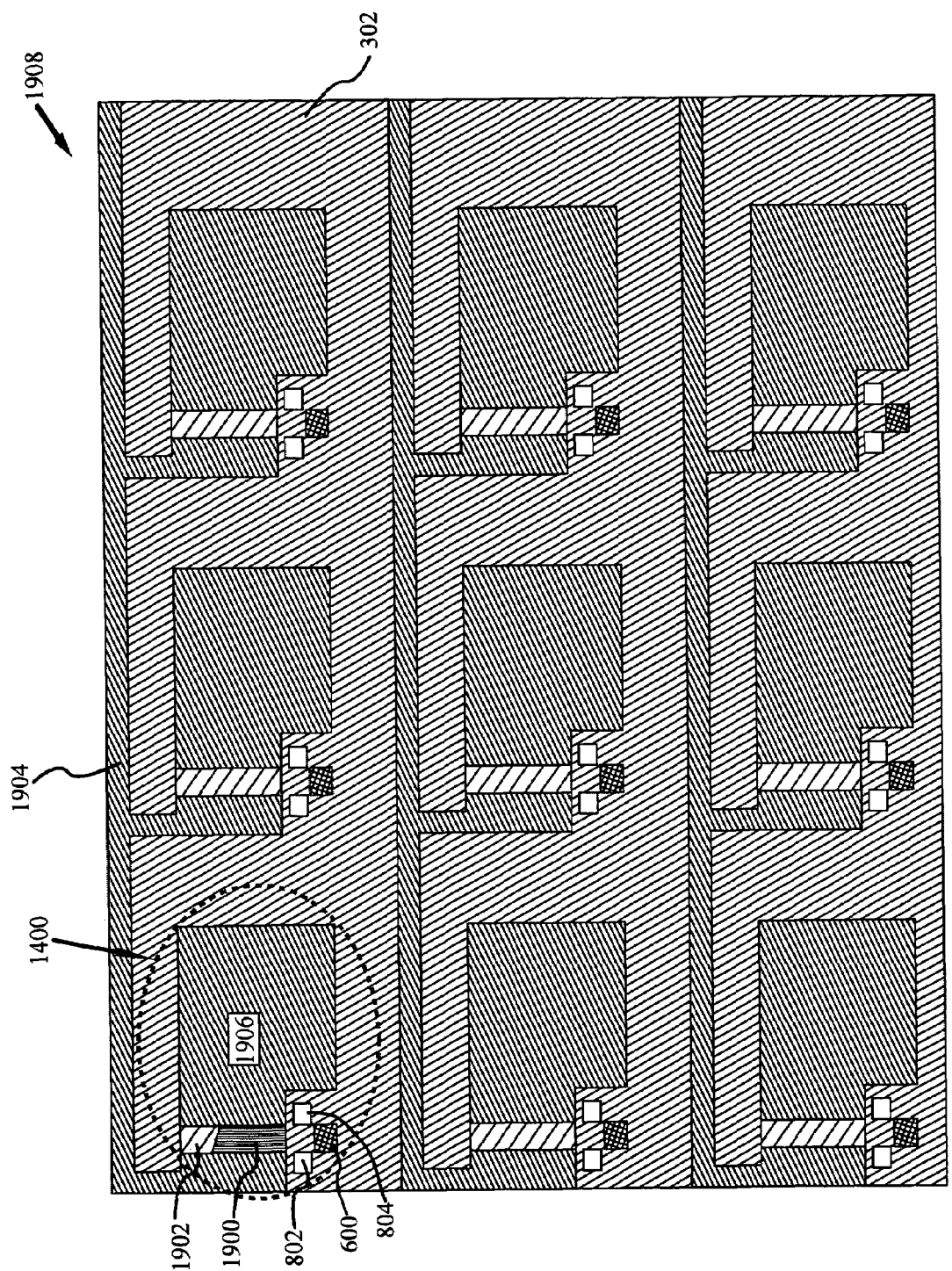
FIG. 19 illustrates an active matrix of TFT devices in accordance with an embodiment.

FIG. 19 illustrates an embodiment providing a plurality of TFTs 1400. Specifically a plurality of gate controls 1900 are dispersed upon the substrate 200 (not specifically shown), each gate control 1900 provided by parallel spaced electrically conductive strips as shown and described above. A plurality of channels 1902 are also provided, each disposed upon a gate control 1900 transverse to the conductive strips. A plurality of electrically isolated data lines 1904 are also provided, each data line 1904 electrically coupled to at least one channel 1902. A plurality of individually bounded electrodes 1906 are also present, each bounded electrode 1906 being coupled to a channel 1902 opposite from a data line 1904.

Such a configuration provides an active matrix array 1908, wherein a specific bounded electrode 1906 may be addressed by powering a selected gate control 1900 of at least one conductive strip of the corresponding TFT 1400 and providing electrical signal at corresponding data line 1904. Conductive pad 600 and cut-off vias 802 and 804 associated with the selected TFT device 1400 ensure proper alignment of the gate control to the channel 1902 of the desired TFT device 1400.

Such an active matrix array, and specifically the bounded electrodes 1906, may be used as pixel electrodes in a display screen. More specifically, a plurality of TFTs may be provided as an active matrix backplane for a display screen. In such embodiments, the TFTs control the display pixels (at least one TFT per pixel). It is understood and appreciated that, with respect to the viewer, the pixels may be in front of the backplane and thus facing the viewer, or behind the transparent backplane and thus shining through the backplane to reach the viewer.

With large pixels or small pixels, it is possible to achieve transparent or semi-transparent display screens via the use of transparent materials discussed above. Depending upon the thickness of the etched stack 300 of thin film layers, to some extent, TFTs made with common materials such as Al, Au, Cu, Si, SiN, Cr or the like may also be used to provide TFTs and matrix conductors of sufficiently small and thin size so as not to be visually obvious or intrusive. In other words, the TFTs may be designed to have small enough thicknesses and small enough widths and intervening aperture spacing between components that they are nearly transparent and/or the loss of light due to absorption is minimal.

Moreover, a transparent TFT may be provided by utilizing transparent materials, by providing devices of such minute scale and with intervening aperture spacing, or by combining both transparent materials with a minute scale. The ability to provide a matrix of high quality TFTs as transparent or semi-transparent backplane displays may be highly desirable in the fabrication of video displays. For example, heads-up displays as might be used to display navigation information on the windshield of a vehicle (car, aircraft, submarine, etc. . . . ) may advantageously be easily fabricated.

Changes may be made in the above methods, systems and structures without departing from the scope thereof. It should thus be noted that the matter contained in the above description and/or shown in the accompanying drawings should be interpreted as illustrative and not in a limiting sense. The following claims address all generic and specific features described herein, as well as all statements of the scope of the present method, system and structure which, as a matter of language, might be said to fall therebetween.

What is claimed is:

1. A method of forming at least one TFD device, comprising:
   providing a substrate;
   providing a plurality of parallel spaced electrically conductive strips upon the substrate;
   depositing a plurality of thin film device layers upon the conductive strips;
   providing a 3D structure upon the plurality of thin film device layers, the 3D structure having a plurality of different heights; and
   etching the 3D structure and plurality of thin film device layers to define a TFD device disposed above at least a portion of the conductive strips, a plurality of the portion of conductive strips collectively providing a segmented electrode.

2. The method of claim 1, wherein the TFD device is a TFT device having a source electrode, a drain electrode, and a channel disposed above at least a portion of the conductive strips providing a segmented gate electrode, wherein a conductor is not coupled to the channel above the segmented gate electrode.

3. The method of claim 1, wherein each TFD incorporates at least two conductive strips as a segmented electrode.

4. The method of claim 1, wherein each TFD incorporates at least two conductive strips providing a nano-gap electrode.

5. A method of forming at least one TFD device, comprising:
   providing a substrate;
   providing a plurality of parallel spaced electrically conductive strips upon the substrate;
   depositing a plurality of thin film device layers upon the conductive strips;
   providing a 3D structure upon the plurality of thin film device layers, the 3D structure having a plurality of different heights; and
   etching the 3D structure and plurality of thin film device layers to define at least a source electrode, a drain electrode, and a channel disposed above at least a portion of the conductive strips, a plurality of the portion of conductive strips collectively providing a segmented gate electrode.

6. The method of claim 5, wherein each conductive strip has a width at least equal to the spacing between the conductive strips.

7. The method of claim 5, further including providing a conductive pad upon at least a portion of the conductive strips, the conductive pad disposed between and separate from the source electrode and drain electrode.

8. The method of claim 7, further including establishing cutoff vias adjacent to the conductive strips disposed beneath the channel.

9. The method of claim 8, wherein the cutoff vias of a second TFD realign the segmented gate electrode to passing beneath the channel of a first TFD to the channel of the second TFD.

10. The method of claim 5, wherein a conductor is not coupled to the channel above the segmented gate electrode provided by the portion of conductive strips.

11. The method of claim 5, wherein each conductive strip has a width of about one to three µm and a height about between one hundred to three hundred nm.

12. The method of claim 5, wherein the conductive strips are provided by:
depositing a metal film upon the substrate; and
performing imprint lithography upon the metal film to define a plurality of parallel evenly spaced conductive strips, the conductive strips being about identical.

13. The method of claim 5, wherein the 3D template provides a first level defining gate line connection, a second level for cutting conductive strips on either side of the channel, a third level for establishing the source electrode and the drain electrode, and a fourth level for the establishing the channel.

14. The method of claim 5, wherein the thin film device layers include:
a dielectric layer;
a semiconductor layer upon the dielectric layer; and
a top metal layer upon the semiconductor layer.

15. The method of claim 14, further including a doped semiconductor layer between the top metal layer and the semiconductor layer.

16. The method of claim 5, wherein the method provides a plurality of thin film devices in an array as an active matrix backplane.

17. The method of claim 5, wherein the substrate is flexible.

18. The method of claim 5, wherein each TFD incorporates at least two conductive strips as a segmented electrode.

19. The method of claim 5, wherein each TFD incorporates at least two conductive strips providing a nano-gap electrode.

20. A method of forming at least one TFD device, comprising:
providing a substrate;
providing a plurality of parallel spaced conductive strips upon the substrate;
depositing a plurality of thin film device layers, upon the conductive strips;
providing a 3D structure upon the plurality of thin film device layers, the 3D structure providing at least four substantially different vertical levels;
etching the 3D structure to remove the lowest vertical level and expose at least a first portion of conductive strips;
providing a conductive pad upon the exposed first portion of conductive strip, the conductive pad enabling the first portion of conductive strips as a segmented electrode;
etching the 3D structure to remove the second lowest vertical level and expose at least a second portion of conductive strips adjacent to and offset from the first portion of conductive strips;
removing the exposed second portion of conductive strips;
etching the 3D structure to remove the third lowest vertical level and expose a portion of the thin film layers;
etching the exposed portion of the thin film layers to remove the exposed portions of the thin film layers;
etching the 3D structure to remove the fourth lowest vertical level and expose a portion of the thin film layers disposed above the first portion of conductive strips;
etching the exposed portion of the thin film layers to provide a channel above the first portion of conductive strips providing the segmented electrode; and
removing the remaining 3D structure to provide a source electrode and a drain electrode aligned to the channel.

21. The method of claim 20, wherein each conductive strip has a width greater than the spacing between the conductive strips.

22. The method of claim 20, wherein providing the conductive pad upon the first portion of conductive strips and removing the exposed second portion of conductive strips aligns the first portion of conductive strips to the channel.

23. The method of claim 20, wherein the plurality of thin film layers includes at least a dielectric layer, a semiconductor layer and a top metal layer.

24. The method of claim 20, wherein a conductor is not coupled to the channel above the segmented gate electrode provided by the first portion of conductive strips.

25. The method of claim 20, wherein each TFD incorporates at least two conductive strips as a segmented electrode.

26. The method of claim 20, wherein each TFD incorporates at least two conductive strips providing a nano-gap electrode.

* * * * *

UNITED STATES PATENT AND TRADEMARK OFFICE
CERTIFICATE OF CORRECTION

| | |
|---|---|
| PATENT NO. | : 7,341,893 B2 |
| APPLICATION NO. | : 11/144204 |
| DATED | : March 11, 2008 |
| INVENTOR(S) | : Ping Mei et al. |

Page 1 of 1

It is certified that error appears in the above-identified patent and that said Letters Patent is hereby corrected as shown below:

In column 15, line 45, in Claim 20, delete "strip" and insert -- strips --, therefor.

Signed and Sealed this

Twenty-sixth Day of August, 2008

JON W. DUDAS
*Director of the United States Patent and Trademark Office*